United States Patent
Chung et al.

(10) Patent No.: US 12,444,601 B2
(45) Date of Patent: Oct. 14, 2025

(54) SEMICONDUCTOR DEVICE AND METHOD OF FORMING THEREOF

(71) Applicant: Taiwan Semiconductor Manufacturing Co., Ltd., Hsinchu (TW)

(72) Inventors: Han-Pin Chung, Fongshan (TW); Chi-Kang Liu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 414 days.

(21) Appl. No.: 16/929,556

(22) Filed: Jul. 15, 2020

(65) Prior Publication Data
US 2021/0233764 A1 Jul. 29, 2021

Related U.S. Application Data

(60) Provisional application No. 62/966,755, filed on Jan. 28, 2020.

(51) Int. Cl.
*H01L 21/02* (2006.01)
*H10D 30/01* (2025.01)
*H10D 30/62* (2025.01)
*H10D 84/01* (2025.01)
*H10D 84/03* (2025.01)

(52) U.S. Cl.
CPC .... *H01L 21/0223* (2013.01); *H01L 21/02348* (2013.01); *H10D 30/0243* (2025.01); *H10D 30/62* (2025.01); *H10D 84/0158* (2025.01); *H10D 84/038* (2025.01)

(58) Field of Classification Search
CPC ......... H01L 21/02164; H01L 21/02219; H01L 21/0223; H01L 21/02263; H01L 21/02326; H01L 21/02337; H01L 21/02343; H01L 21/02348; H01L 21/76224; H01L 21/823431; H01L 21/823821; H01L 21/823878; H01L 29/66795; H01L 29/6681; H01L 29/785; H10D 30/024; H10D 30/62; H10D 84/0158; H10D 84/0193
See application file for complete search history.

(56) References Cited

U.S. PATENT DOCUMENTS 7,109,516 B2 * 9/2006 Langdo ............ H01L 21/76259
438/137
7,521,375 B2 * 4/2009 You .................. H01L 21/31662
438/770

(Continued)

FOREIGN PATENT DOCUMENTS

CN 201125037 A 7/2011
CN 108231888 A 6/2018
(Continued)

*Primary Examiner* — Mary A Wilczewski
(74) *Attorney, Agent, or Firm* — Slater Matsil, LLP

(57) ABSTRACT

A semiconductor device and a method of forming a semiconductor device include forming a dielectric material, performing a wet oxidation treatment on the dielectric material, and performing a dry anneal on the dielectric material. The dielectric material may be a flowable material. The wet oxidation treatment may include an acid and oxidizer mixture.

20 Claims, 36 Drawing Sheets

(56) References Cited

U.S. PATENT DOCUMENTS

| | | | |
|---|---|---|---|
| 8,580,649 B2* | 11/2013 | Miyahara | H01L 21/76224 257/E21.546 |
| 8,846,536 B2* | 9/2014 | Draeger | H01L 21/02271 216/87 |
| 9,390,914 B2* | 7/2016 | Wang | H01L 21/02343 |
| 10,038,079 B1* | 7/2018 | Ohtou | H01L 21/823431 |
| 10,211,045 B1 | 2/2019 | Krishnan et al. | |
| 10,516,038 B2* | 12/2019 | Ohtou | H01L 29/7856 |
| 10,790,381 B2* | 9/2020 | Ohtou | H01L 29/7856 |
| 11,289,589 B2* | 3/2022 | Ohtou | H01L 29/785 |
| 2011/0151677 A1* | 6/2011 | Wang | H01L 21/02343 257/E21.283 |
| 2013/0181263 A1* | 7/2013 | Cai | H01L 29/785 438/424 |
| 2013/0230987 A1 | 9/2013 | Draeger et al. | |
| 2013/0330906 A1* | 12/2013 | Yu | H01L 21/76224 257/E21.546 |
| 2015/0179501 A1* | 6/2015 | Jhaveri | H01L 21/76224 438/424 |
| 2015/0179503 A1* | 6/2015 | Tsai | H01L 29/36 438/433 |
| 2018/0151564 A1* | 5/2018 | Lee | H01L 29/66545 |
| 2018/0166327 A1* | 6/2018 | Hsiao | H01L 21/823431 |
| 2018/0337266 A1 | 11/2018 | Ohtou et al. | |
| 2019/0165174 A1* | 5/2019 | Peng | H01L 29/66545 |
| 2021/0233764 A1* | 7/2021 | Chung | H01L 21/76224 |

FOREIGN PATENT DOCUMENTS

| | | | | |
|---|---|---|---|---|
| CN | 108695388 | * | 10/2018 | H01L 29/66795 |
| DE | 10 2017 110 846 | * | 10/2018 | H01L 29/66795 |
| JP | 2013-515355 | * | 5/2013 | H01L 21/02326 |
| KR | 10-2018-0060909 | * | 6/2018 | H01L 29/66795 |
| TW | 201933451 A | | 8/2019 | |

* cited by examiner

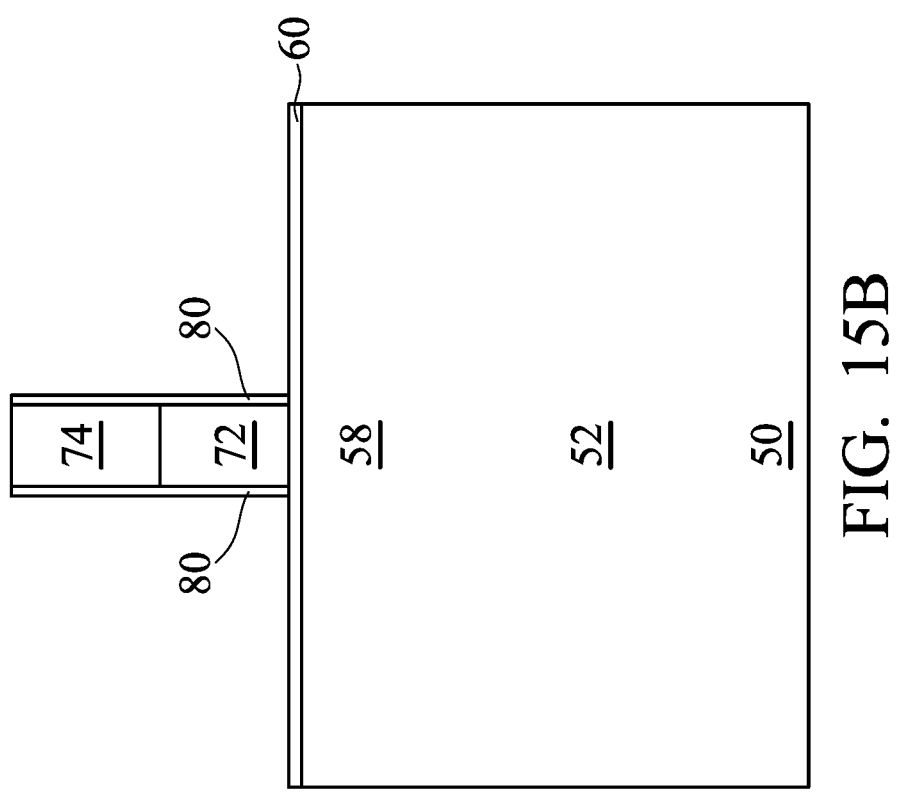

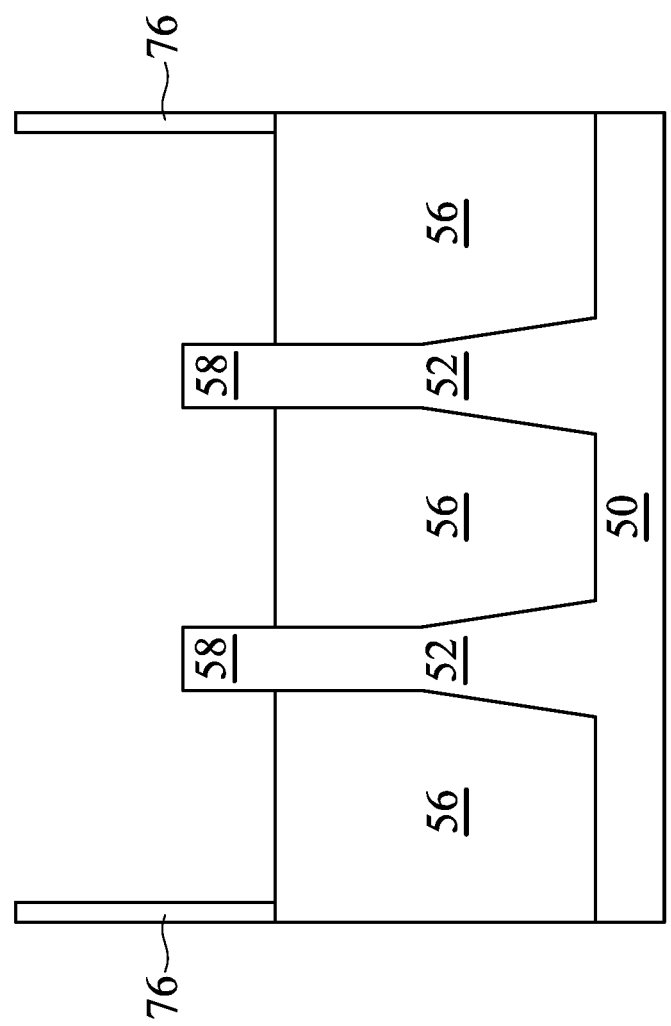

SEMICONDUCTOR DEVICE AND METHOD OF FORMING THEREOF

PRIORITY CLAIM AND CROSS-REFERENCE

This application claims the benefit of U.S. Provisional Application No. 62/966,755, filed on Jan. 28, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12, 13, 14, 15A, 15B, 16A, 16B, 17A, 17B, 17C, 17D, 18A, 18B, 19A, 19B, 20A, 20B, 21A, 21B, 21C, 22A, 22B, 23A, and 23B are cross-sectional views of intermediate stages in the manufacturing of FinFETs, in accordance with some embodiments.

DETAILED DESCRIPTION

Figure 1:
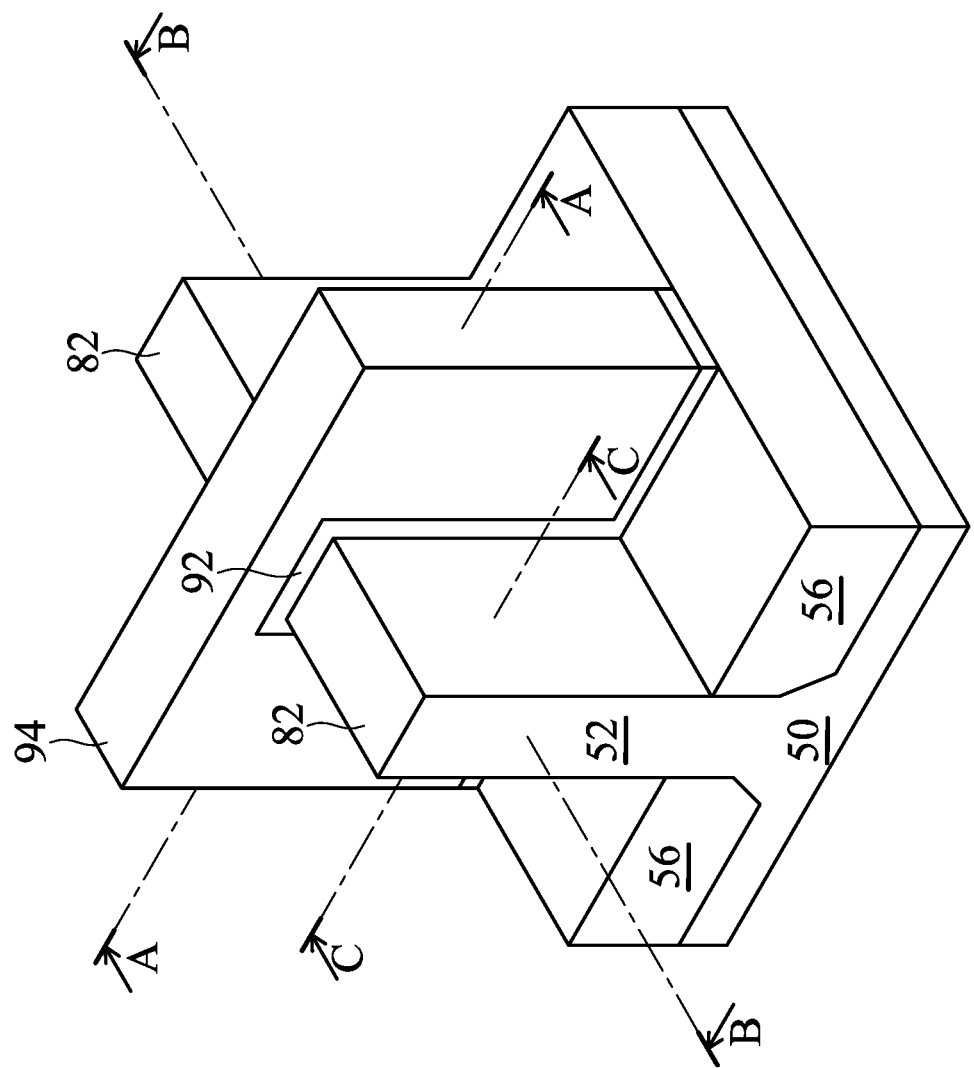
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower." "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments such as those discussed herein include a method of forming an insulating material such as an oxide layer and the resulting structure. Generally, the embodiments include a process of forming an oxide including the steps of depositing an oxide, curing the oxide using, for example, an oxygen environment and/or an ultra-violet curing process, performing a wet oxidation treatment, and performing a dry (steamless) anneal. In some embodiments, the oxide may be formed using a flowable chemical vapor deposition (FCVD) process. In some embodiments, processes such as those discussed herein may exhibit fewer issues, such as the consumption of oxide definition (OD) regions, Si and/or SiGe fin oxidation, metal gate threshold voltage ($V_t$) shift, and/or the like.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 8 and 12 through 23B are cross-sectional views of intermediate stages in the manufacturing of FinFETs, in accordance with some embodiments. FIGS. 2 through 8 and 12 through 14 illustrate reference cross-section A-A illustrated in FIG. 1, except for multiple fins/FinFETs. FIGS. 15A, 16A, 17A, 18A. 19A, 20A, 21A, 22A, and 23A are illustrated along reference cross-section A-A illustrated in FIG. 1, and FIGS. 15B, 16B, 17B, 18B, 19B, 20B, 21B, 21C, 22B, and 23B are illustrated along a similar cross-section B-B illustrated in FIG. 1, except for multiple fins/FinFETs. FIGS. 17C and 17D are illustrated along reference cross-section C-C illustrated in FIG. 1, except for multiple fins/FinFETs.

Figure 2:
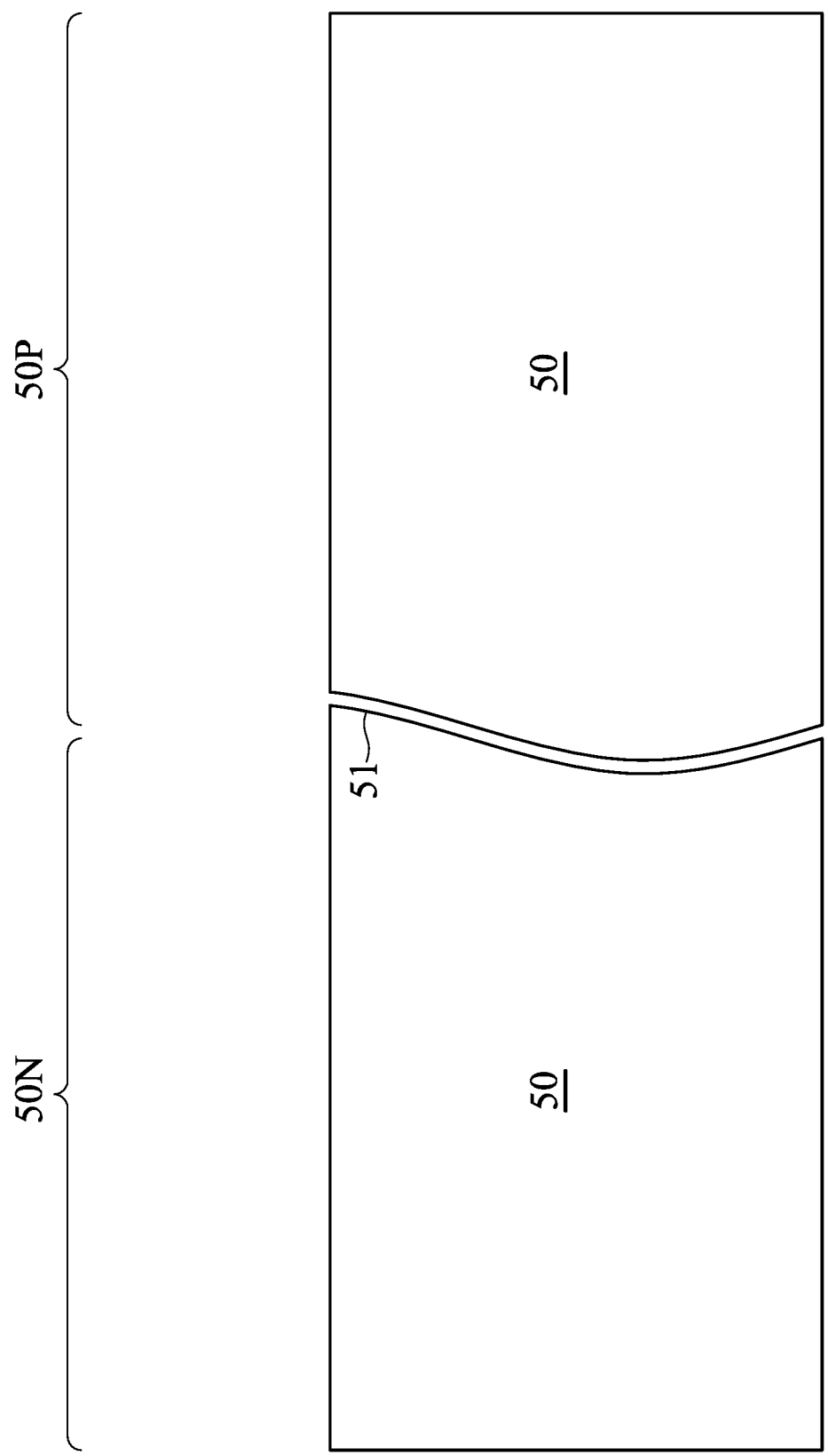
FIGS. 2, 3, 4, 5, 6, 7, and 8 are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
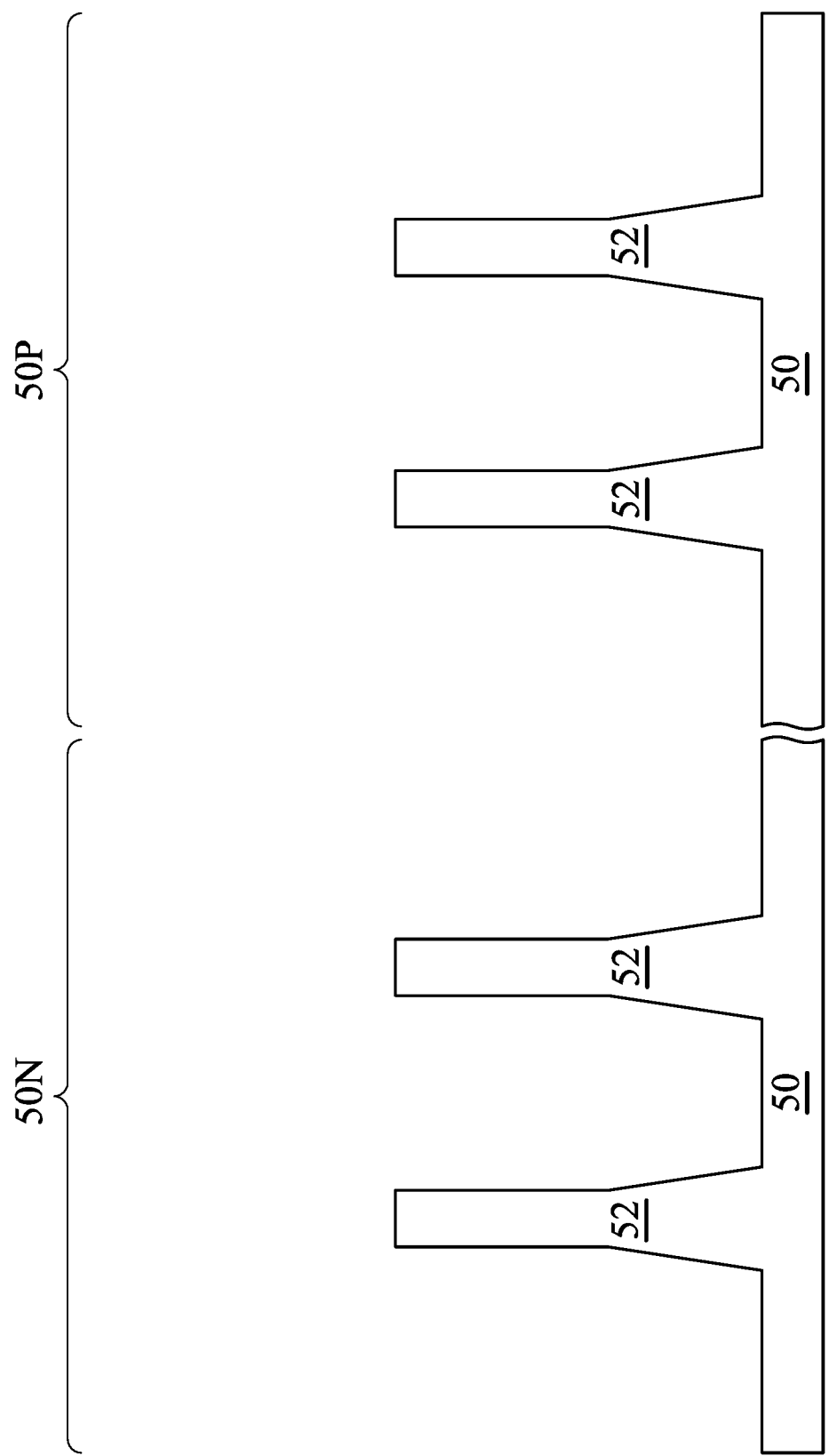

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
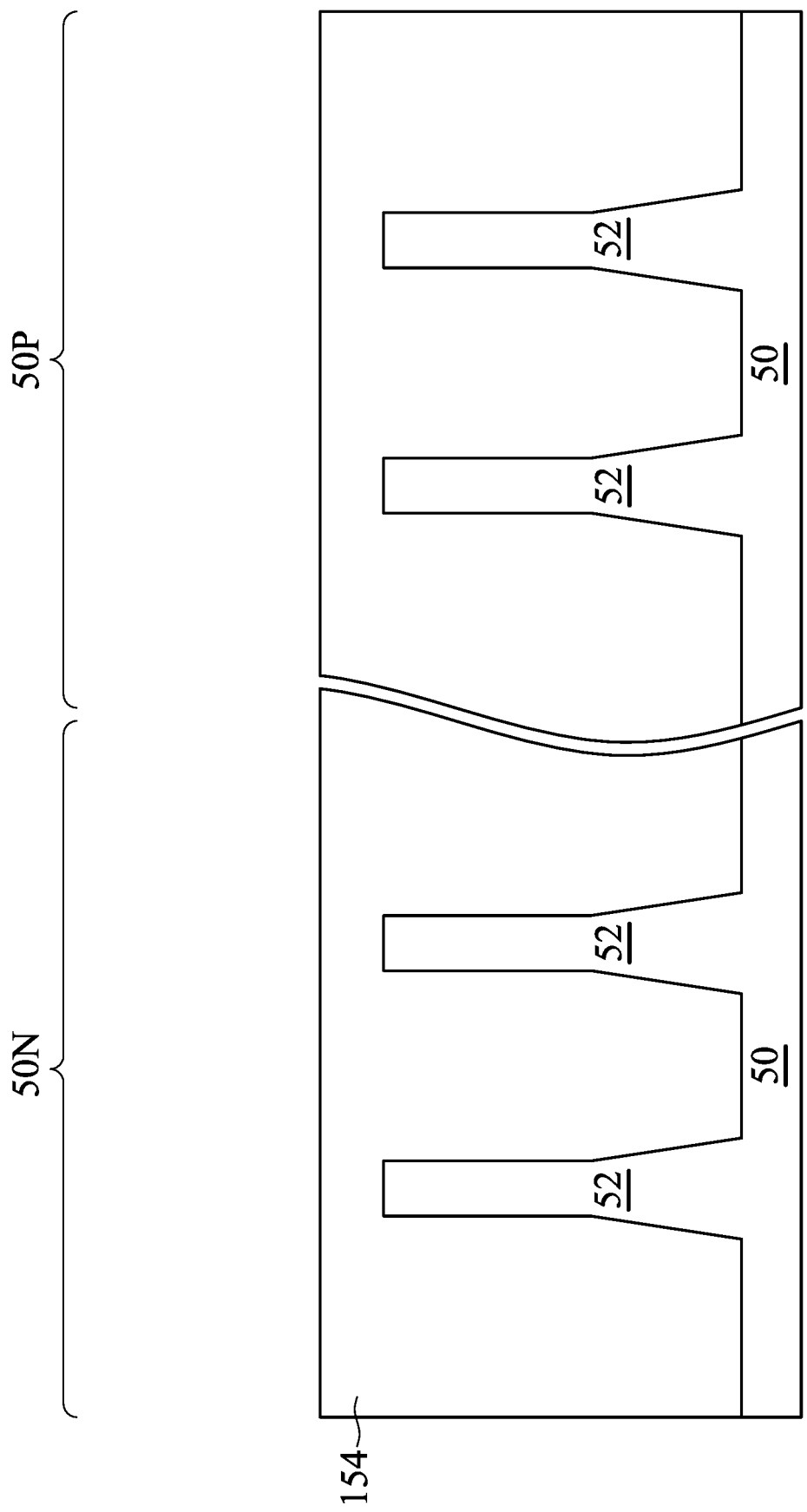

In FIG. 4, a dielectric material 154 is formed over the fins 52 and the substrate 50. The dielectric material 154 may be a flowable dielectric material that can "flow" during deposition to fill voids in a gap. In a particular embodiment the dielectric material is a flowable material such as perhydropolysilazane (PSZ), a tetraethyl orthosilicate (TEOS) formed silicon oxide, or a silyl-amine, such as trisilylamine (TSA), combinations of these, or the like. However, any suitable material may be utilized to help fill the gaps and avoid voids.

The dielectric material 154 may be formed using a high-density plasma chemical vapor deposition (HDP-CVD), a flowable CVD (FCVD), combinations of these, or the like, in which precursors materials are introduced to the surfaces and react with each other in order to deposit the desired materials (e.g., PSZ). Additionally, in some embodiments, various chemistries may be added to the precursors in order to allow the deposited material (e.g., PSZ) to flow once it has been deposited.

For example, in one particular embodiment in which the dielectric material 154 is desired to be PSZ, a combination of precursors and diluents may be introduced to deposit the dielectric material 154. A first precursor that is introduced may be a silicon containing precursor such as trisilylamine (TSA).

A second precursor may also be introduced to react with the TSA. In some embodiments the second precursor is a precursor chosen to help add additional nitrogen hydride bonds to the dielectric material in order to help the deposited material flow. For example, in embodiments in which the first precursor is TSA, the second precursor may be a nitrogen containing precursor such as ammonia ($NH_3$). However, any suitable second precursor may be utilized.

Additionally, a number of other chemicals may be introduced which will help with the process but which do not directly react. For example, diluents, carrier gases, or the like, such as argon, may be utilized to help move or dilute the first precursor or the second precursor, but do not directly participate in the chemical reactions of the deposition process.

Although the dielectric material 154 is illustrated as a single layer, some embodiments may utilize multiple layers. For example, in some embodiments a liner (not shown) may first be formed along a surface of the substrate 50 and the fins 52. Thereafter, the dielectric material 154 may be deposited as a fill material over the liner.

By utilizing a flowable dielectric material such as, e.g., PSZ, as the dielectric material 154, the dielectric material 154 will settle, or "flow", downwards after it has been deposited. As such, any gaps or voids that form during deposition, and especially any gaps or voids that form between the fins 52, will be filled. As such, a more complete filling of the regions between the fins 52 can be achieved.

Figure 5:
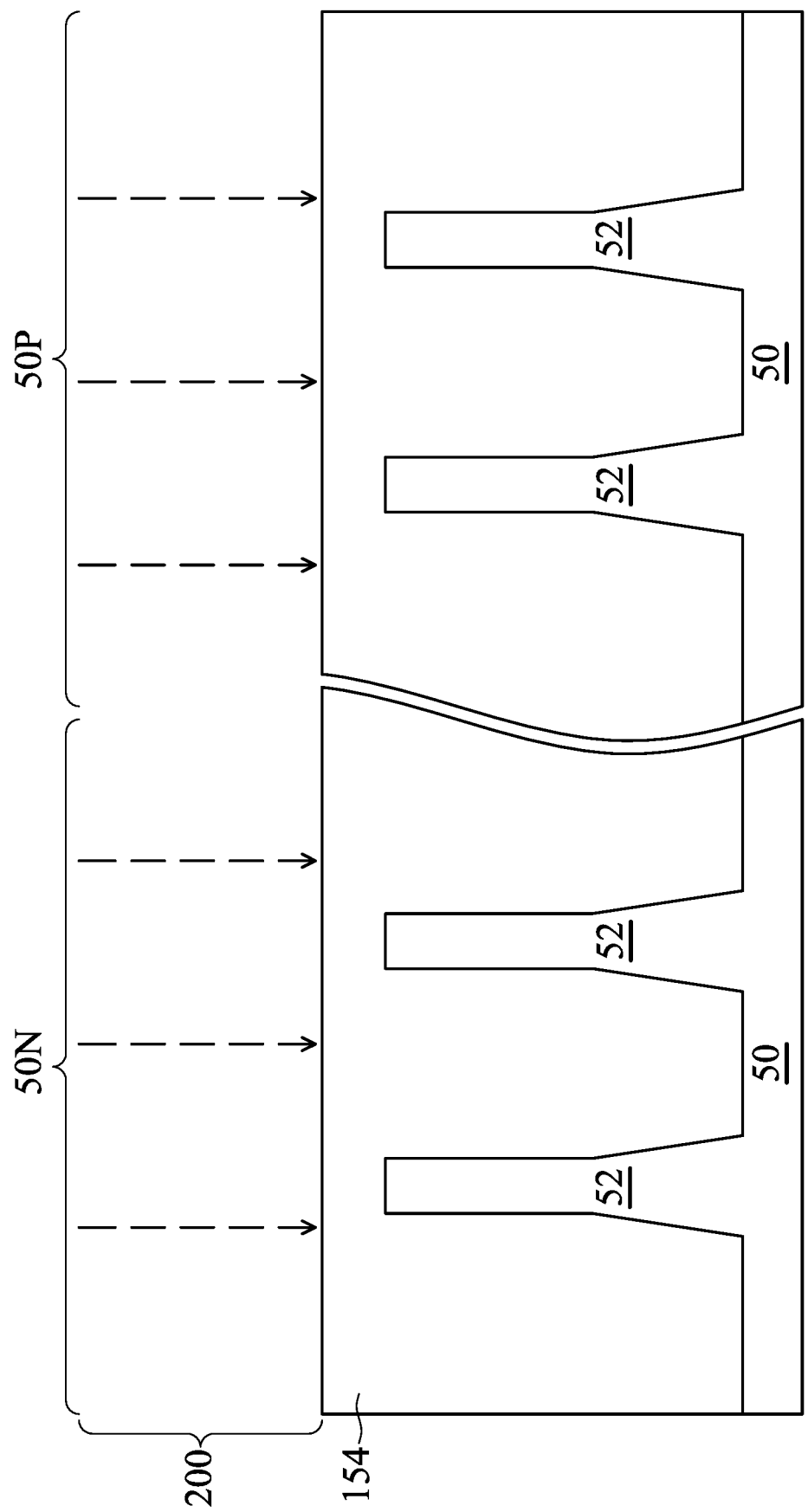

In FIG. 5, an optional first cure 200 may be performed on the dielectric material 154. In an embodiment the first cure 200 may be, for example, an ozone cure which may improve properties of the dielectric material 154 by introducing additional oxygen to the dielectric material 154. The first cure 200 may be performed at a temperature in a range of about 300° C. to about 1000° C., with a flow rate in a range of about 10 sccm to about 10 L/min, for a duration in a range of about 15 minutes to about 8 hours. However, any suitable parameters may be utilized.

Figure 6:
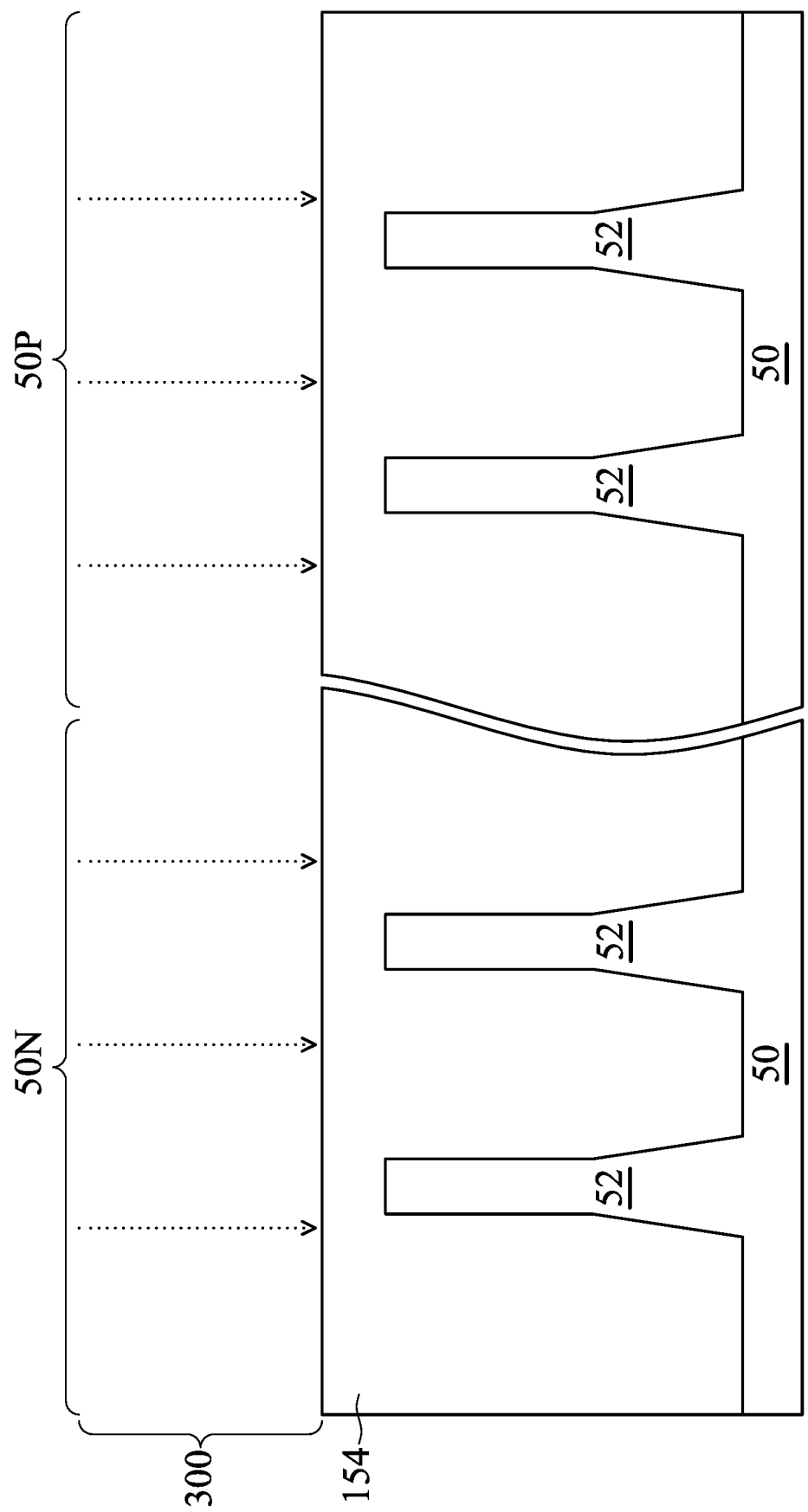

In FIG. 6, an optional second cure 300 may be performed on the dielectric material 154. In an embodiment the second cure 300 may be an ultra-violet (UV) cure which may break Si—N bonds in order to produce a more solid oxide with subsequent processes, such as described below with respect to FIGS. 7 and 8. The second cure 300 may be performed with a wavelength in a range of about 10 nm to about 400 nm. A time interval for the UV cure 300 may be between about 10 seconds and about 30 minutes, although other values are also possible.

Additionally, while a multiple step curing process is described above (e.g., the first cure 200 followed by the second cure 300), this is intended to be illustrative and is not intended to be limiting. Rather, referring to FIGS. 5 and 6, in some embodiments, only the first cure 200 is performed and the second cure 300 is not performed. In some embodiments, only the first cure 200 is performed and the second cure 300 is not performed. In some embodiments, the first cure 200 is performed prior to performing the second cure 300. In some embodiments, the second cure 300 is performed prior to performing the first cure 200. All suitable combinations are fully intended to be included within the scope of the embodiments.

Figure 7:
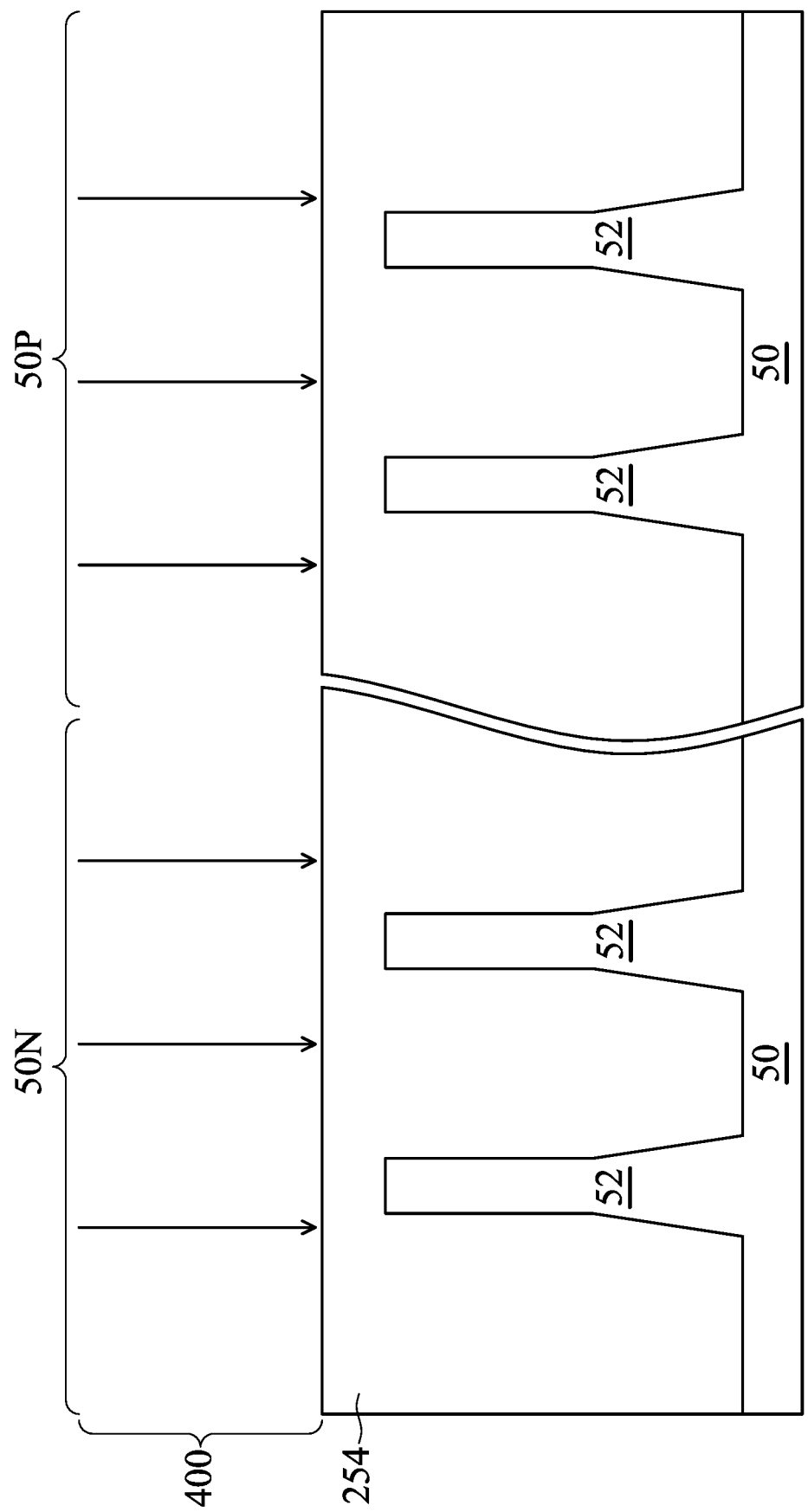

In FIG. 7, a first step of a conversion process comprising a wet oxidation treatment 400 is applied to the dielectric material 154, converting it to an oxidized dielectric material 254. In some embodiments the oxidation can be performed using a mixture of chemicals, wherein the mixture comprises components that help the oxidation process, such as a first acid and a first oxidizer. In an embodiment the first acid may be an acid such as sulfuric acid ($H_2SO_4$), $HNO_3$, or HCl, combinations of these, or the like. Additionally, the first oxidizer may be an oxygen containing chemical, such as hydrogen peroxide ($H_2O_2$), $O_3$, combinations of these, or the like. However, any suitable first acid and first oxidizer may be utilized.

In a particular embodiment the wet oxidation treatment 400 is performed with a mixture of sulfuric acid and hydrogen peroxide (e.g., SPM). For example, the mixture is a solution of liquid sulfuric acid and liquid hydrogen peroxide. In such an embodiment the mixture of sulfuric acid and hydrogen peroxide may be at a ratio in a range of about 1:1 to about 10:1, which may be advantageous for sufficiently oxidizing the dielectric material 154. The wet oxidation treatment 400 may be performed with SPM at a molarity in a range of about 2 M to about 18.4 M, which may be advantageous for sufficiently oxidizing the dielectric material 154. The wet oxidation treatment 400 may be applied at a temperature greater than about 50° C. and less than or equal to about 170° C. In some embodiments, the wet oxidation treatment 400 comprises SPM applied at a temperature greater than about 50° C., referred to as a high temperature sulfuric peroxide mixture (HTSPM) treatment. Applying the wet oxidation treatment 400 at a temperature of less that about 50° C. may not sufficiently oxidize the dielectric material 154. The wet oxidation treatment 400 may be applied uniformly over the dielectric material 154. The application of the wet oxidation treatment 400 may be performed by a suitable wet tool such as, e.g., a nozzle, with a flow rate in a range of about 500 ml/min to about 2200 ml/min. However, any suitable parameters and any suitable application may be utilized.

The wet oxidation treatment 400 may oxidize the dielectric material 154 to an oxidized dielectric material 254. Using the wet oxidation treatment 400 may be useful in converting the dielectric material 154 to an oxide while reducing the oxidation of other features such as the fins 52, which may comprise silicon and/or SiGe, and reducing the consumption of oxidation diffusion (OD) regions in the fins 52. In some embodiments, multiple cycles of the wet oxidation treatment 400 and a following dry anneal 500 (see FIG. 8 below) are performed, such as e.g. two cycles.

Figure 8:
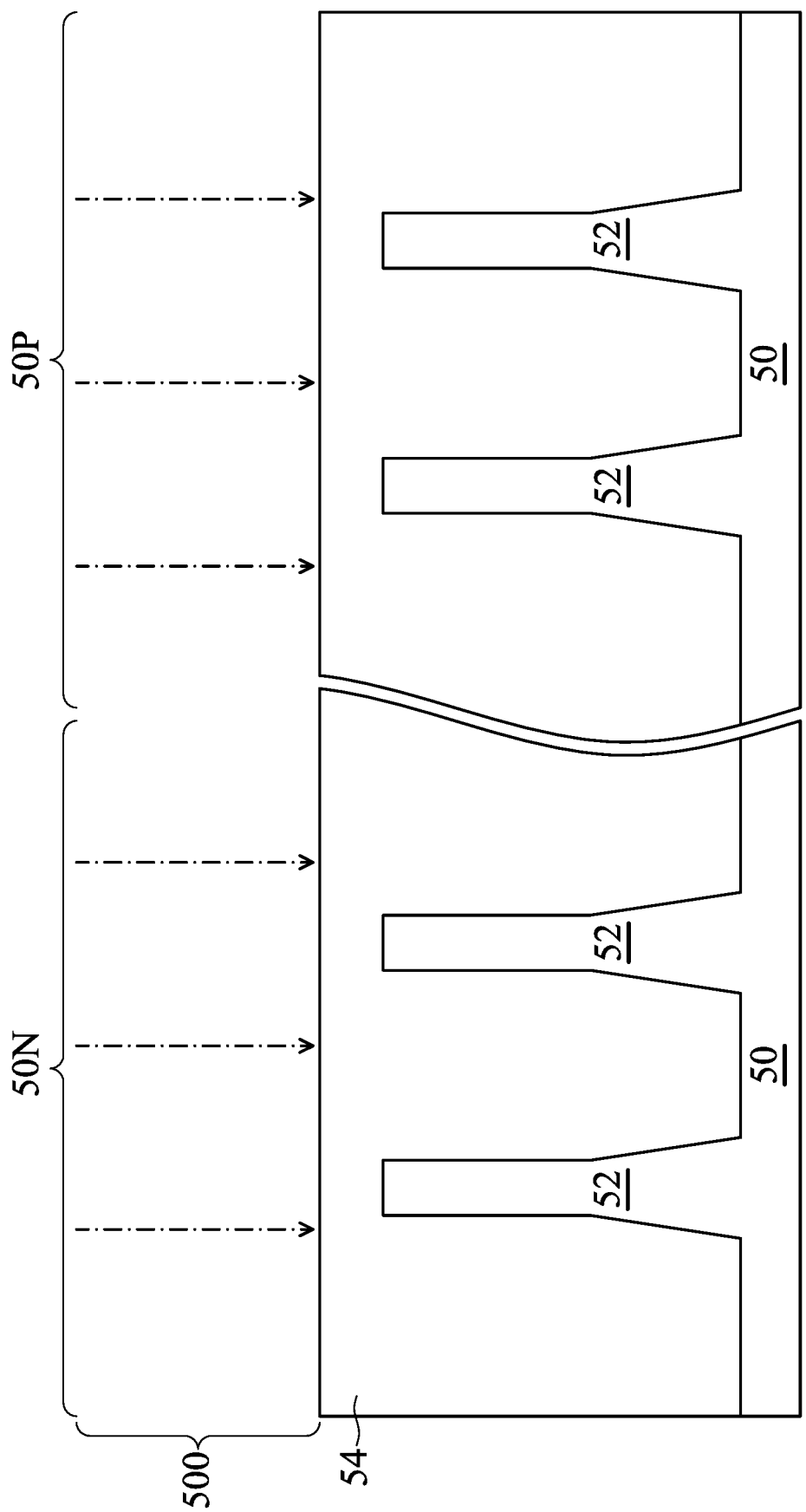

FIG. 8 illustrates a second step of a conversion process comprising a dry anneal 500, which may convert the oxidized dielectric material 254 to an insulation material 54 such as, e.g., silicon oxide and/or silicon dioxide. The dry anneal 500, which may also be referred to as a steamless anneal 500, is performed by a suitable steamless anneal process such as a thermal anneal in an inert environment such as argon, He, the like, or a combination thereof, or in an environment such as a mixture of gases including $H_2$, $O_2$, $N_2$, the like, or a combination thereof, with a volume percentage of $H_2O$ less than about 10%. For example, the dry anneal 500 is performed with a volume percentage of $H_2O$ less than 1%. Performing the dry anneal with a volume percentage of $H_2O$ less than about 1% may enhance film oxidation of the insulation material 54, while reducing the undesired side effect of oxidizing the fins 52. The dry anneal may be performed under a pressure in a range of about 0.5 atm to about 1.2 atm. In particular, while a larger $H_2O$ concentration than a volume percentage of about 1% can make the film quality better, it may also lead to a side effect of Si fins being oxidized. The dry anneal 500 may be performed at a temperature of between about 300° C. and about 800° C., and performing the dry anneal 500 at a temperature in this range may enhance the oxidation ability of the wet oxidation treatment 400 and dry anneal 500. Performing the anneal at a temperature less than about 300° C. may not allow for a sufficient oxidation to form the insulation material 54. Additionally, performing the anneal at a temperature greater than about 800° C. may result in undesired fin oxidation.

In some embodiments, multiple cycles of the wet oxidation treatment 400 (see FIG. 7 above) and the dry anneal 500 are performed in order to help ensure that the process is fully completed. For example, in some embodiments the wet oxidation treatment 400 may be performed a second time and the dry anneal 500 may also be performed a second time to complete yet another cycle. Additionally, the cycles may be repeated any desired number of times. Accordingly, one or more cycles of the wet oxidation treatment 400 and the dry anneal 500 of the disclosure turn the dielectric material 154 into the insulation material 54. During the period of the conversion from the dielectric material 154 to the insulation material 54, a steam anneal process with high temperature more than 450° C. and a volume percentage of steam more than 10% can be avoided. The steam anneal might lead to a side effect of silicon fins being oxidized.

Figure 9:
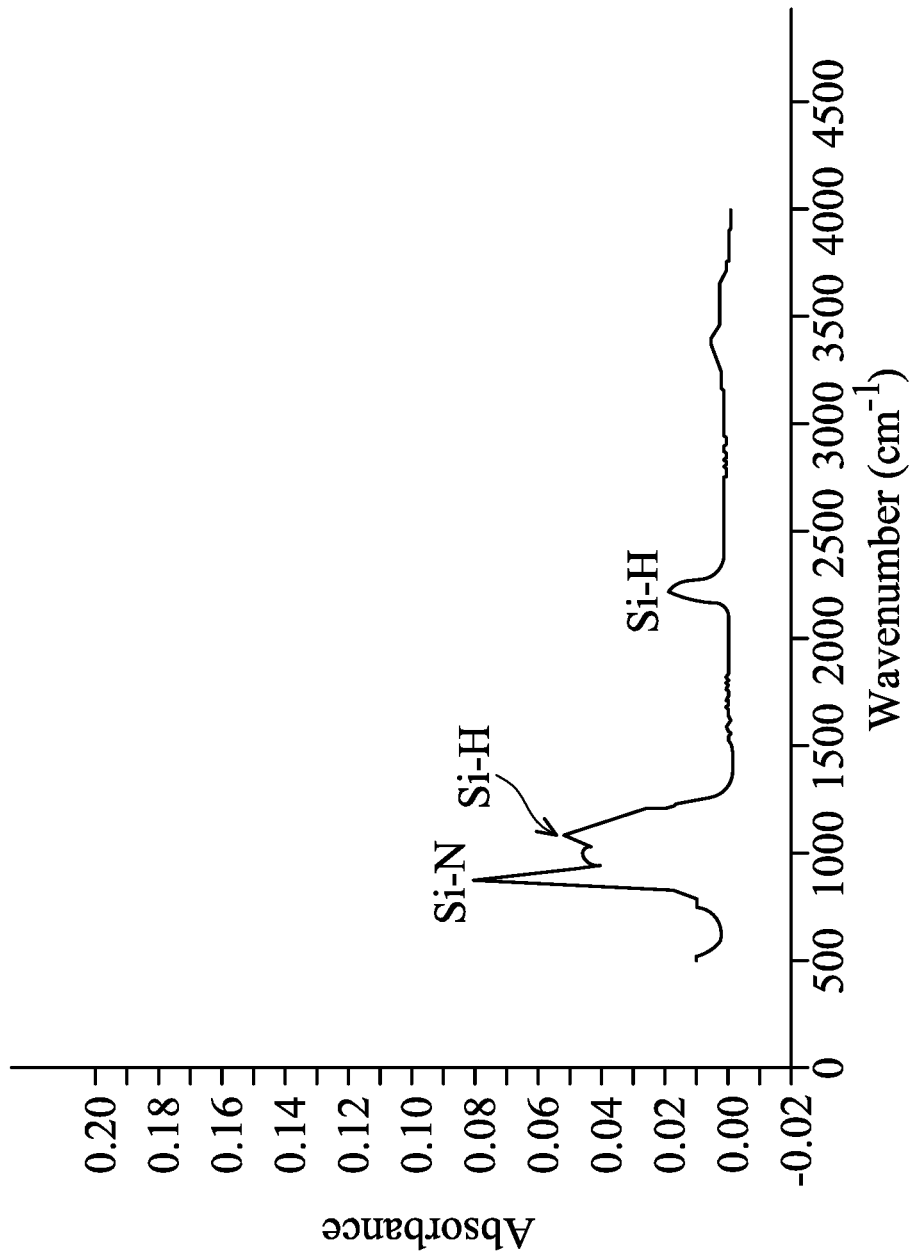
FIGS. 9, 10, and 11 illustrate physical properties of films, in accordance with some embodiments.

FIG. 9 illustrates a graph of the infrared spectrum for the dielectric material 154, e.g. PSZ, in accordance with some embodiments. The dielectric material 154 shown in FIG. 9 may be similar to the dielectric material 154 as shown above in FIG. 4. The infrared spectrum may show peaks at wavenumbers corresponding to bonds such as Si—H and Si—N, which may be common bonds in the dielectric material 154. The wet oxidation treatment 400 and dry anneal 500 illustrated above in FIGS. 7 and 8, may oxidize the dielectric material 154 and break the Si—H and Si—N bonds.

Figure 10:
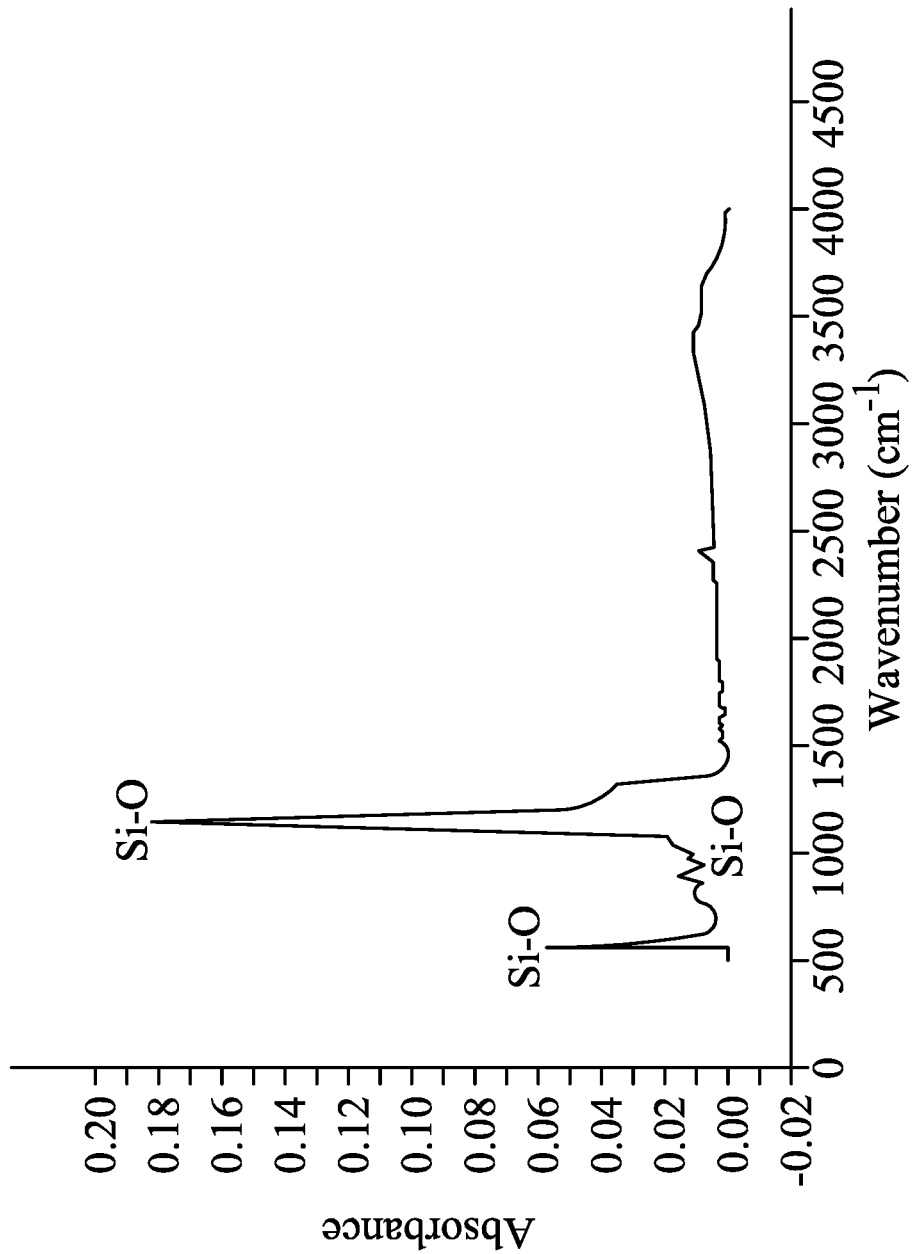

FIG. 10 illustrates a graph of the infrared spectrum for the insulation material 54, e.g. $SiO_2$, after performing at least one cycle of the wet oxidation treatment 400 and the dry anneal 500 as shown in FIGS. 7 and 8, respectively. The peaks at wavenumbers corresponding to bonds such as Si—H and Si—N, as shown above in FIG. 9, are no longer present, and the infrared spectrum is dominated by peaks corresponding to Si—O bonds. This may indicate that the dielectric material 154 has been converted to the insulation material 54 by the wet oxidation treatment 400 and the dry anneal 500. In some embodiments, the insulation material 54 consists essentially of silicon oxide and/or silicon dioxide at the top surface and the oxidation decreases in proportion to distance from the top surface.

Figure 11:
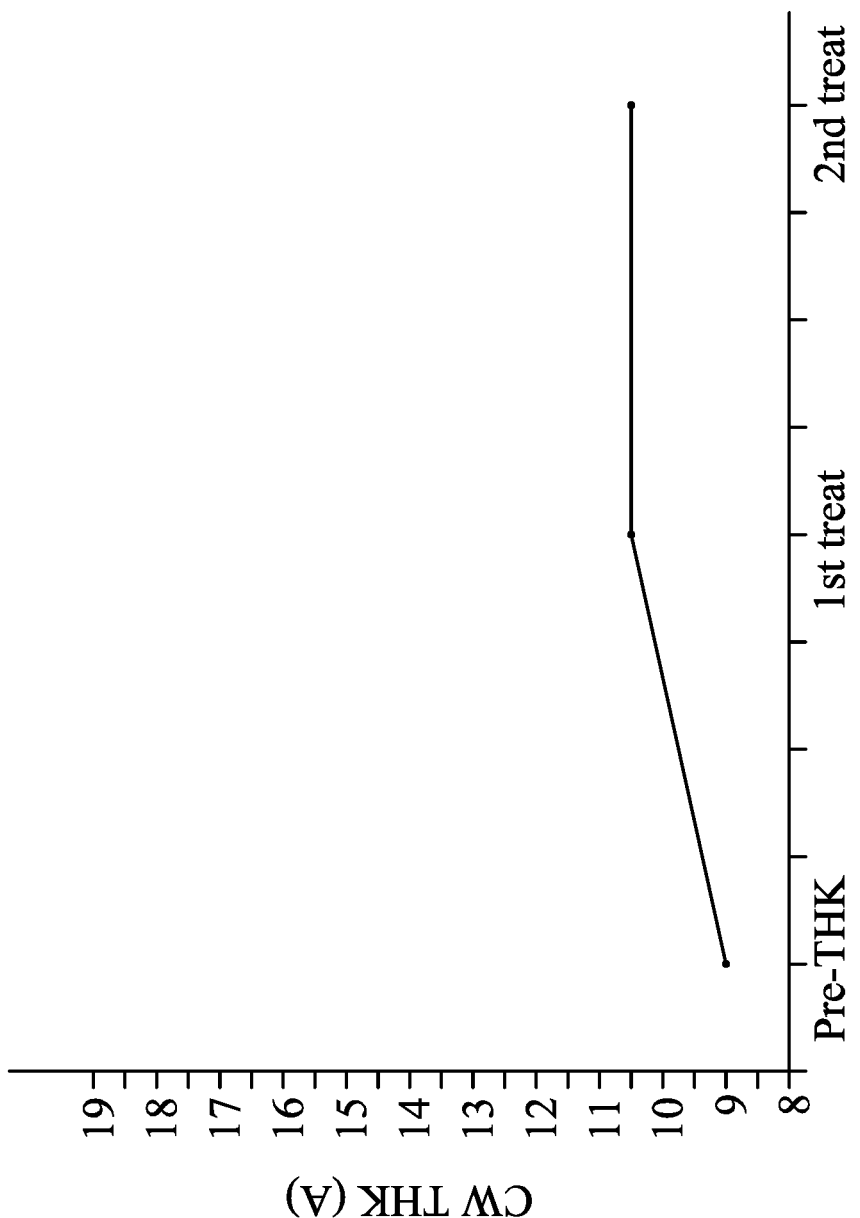

FIG. 11 illustrates a graph of thickness of a test wafer comprising silicon upon which the dielectric material 154 is formed and then treated, with successive cycles of the wet oxidation treatment 400 (see FIG. 7 above) and the dry anneal 500 (see FIG. 8 above) being plotted along the bottom axis. The thickness of the wafer may indicate the amount of oxidation expected to occur on surfaces such as the fins 52 from the oxidation treatment 400 and the dry anneal 500. In some embodiments in accordance with FIG. 11, the wet oxidation treatment 400 is performed at about 170° C. with a molarity in a range of about 2 M to about 18.4 M. Prior to applying the wet oxidation treatment 400, the wafer has a thickness of about 8.5 Å. After one cycle of the wet oxidation treatment 400 and the dry anneal 500, the thickness of the wafer increases to about 10.0 Å, and after a second cycle of the wet oxidation treatment 400 and the dry anneal 500, the thickness of the wafer remains at about 10.0 Å. This may indicate that the wet oxidation treatment 400 and the dry anneal 500, during actual production of devices such as transistors, do not produce significant oxidation of features similar to the silicon of the wafer, which may be useful for reducing the consumption of OD regions in the fins 52 and/or other unwanted oxidation during the conversion of the dielectric material 154 to the insulation material 54.

These flowable silicon oxide materials are formed in a multiple-operation process. After the flowable film is deposited, it is cured and annealed to remove un-desired element(s), such as solvent, to form silicon oxide. When the un-desired element(s) is removed, the flowable film densifies and shrinks. In some embodiments, multiple anneal processes are conducted. The curing and annealing may result in oxidation of the trench walls and widen the isolation regions.

Figure 12:
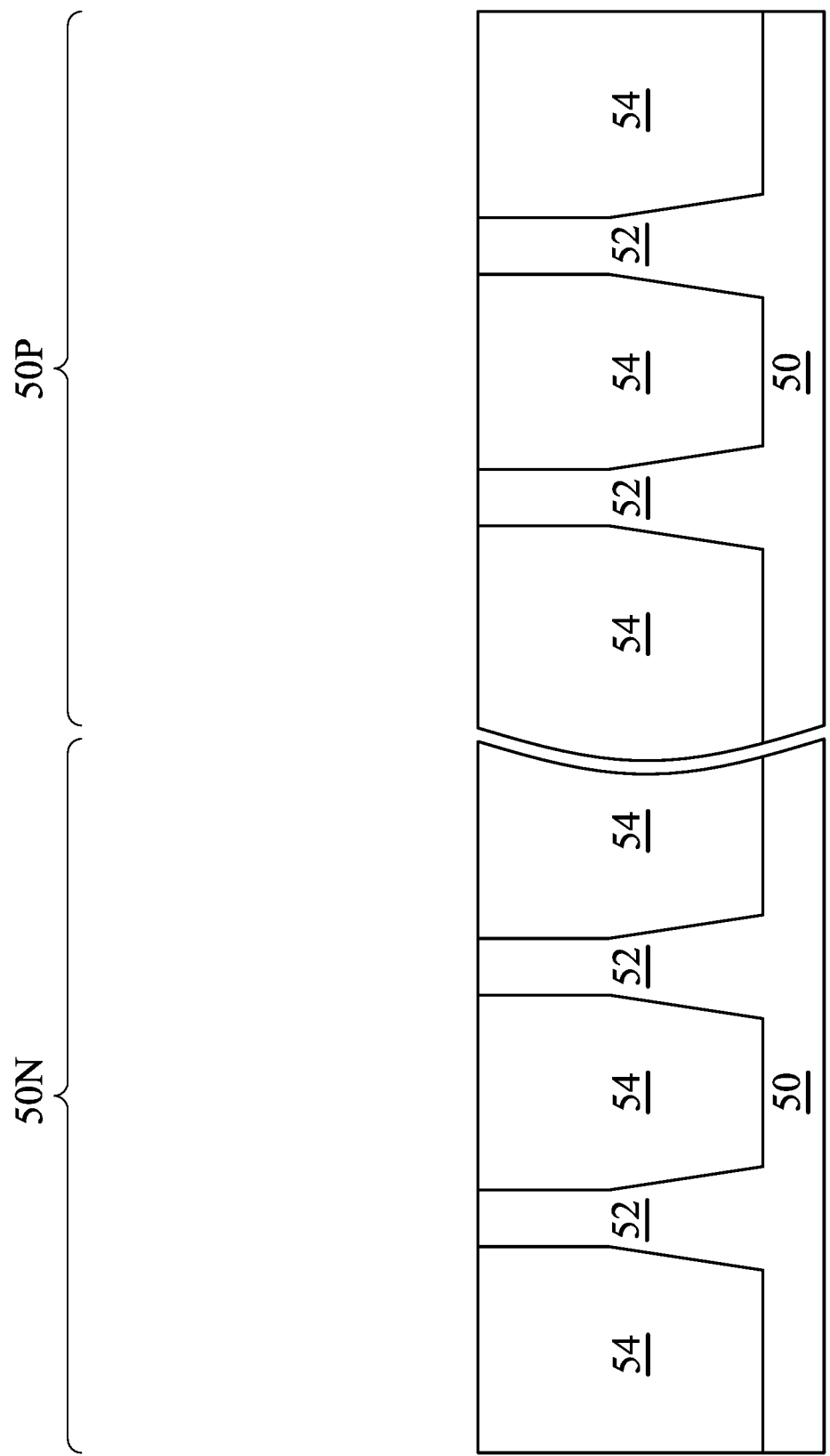

In FIG. 12, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 13:
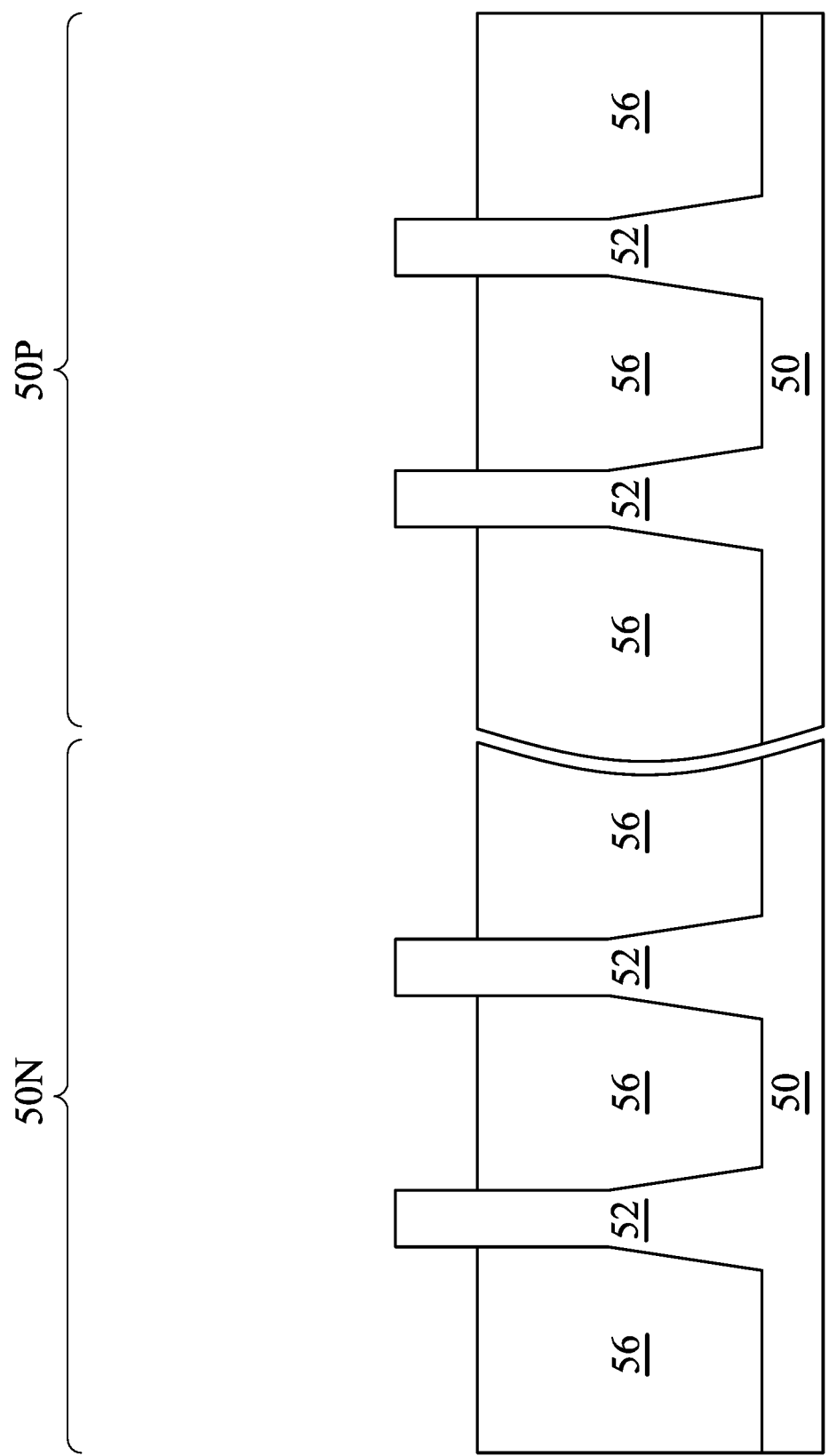

In FIG. 13, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 13 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 13, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 14:
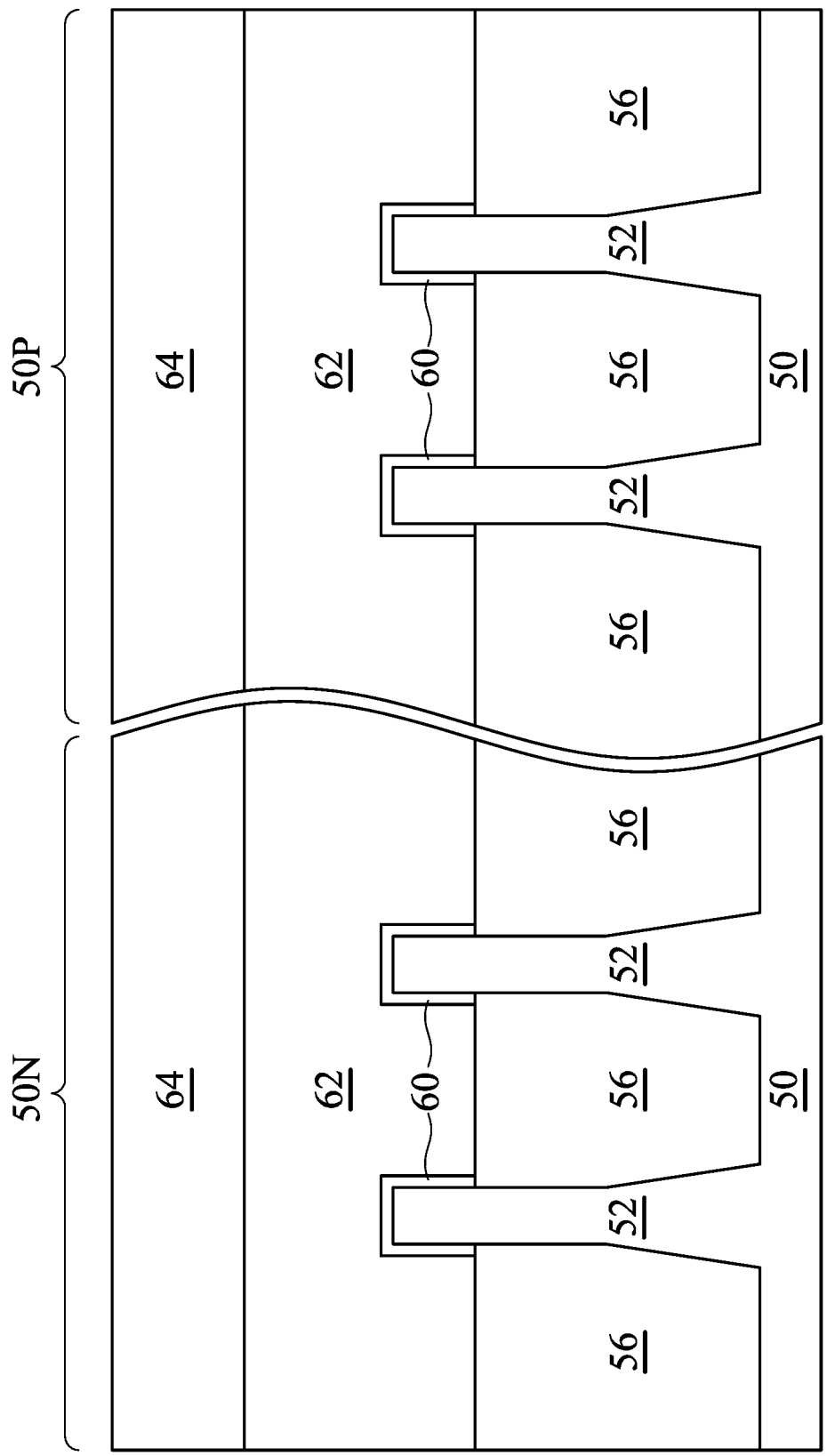

In FIG. 14, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 15A through 23B illustrate various additional steps in the manufacturing of embodiment devices. FIGS. 15A through 23B illustrate features in either of the n-type region 50N and the p-type region 50P. For example, the structures illustrated in FIGS. 15A through 23B may be applicable to both the n-type region 50N and the p-type region 50P. Differences (if any) in the structures of the n-type region 50N and the p-type region 50P are described in the text accompanying each figure.

Figure 15A:
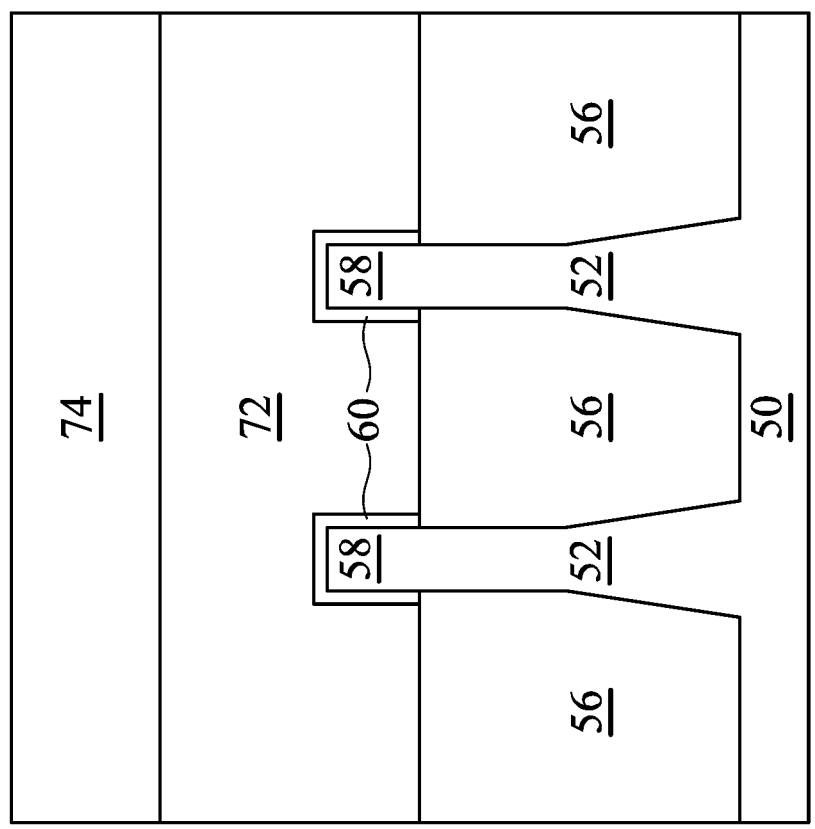

In FIGS. 15A and 15B, the mask layer 64 (see FIG. 14) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 15A and 15B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 13, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 16A:
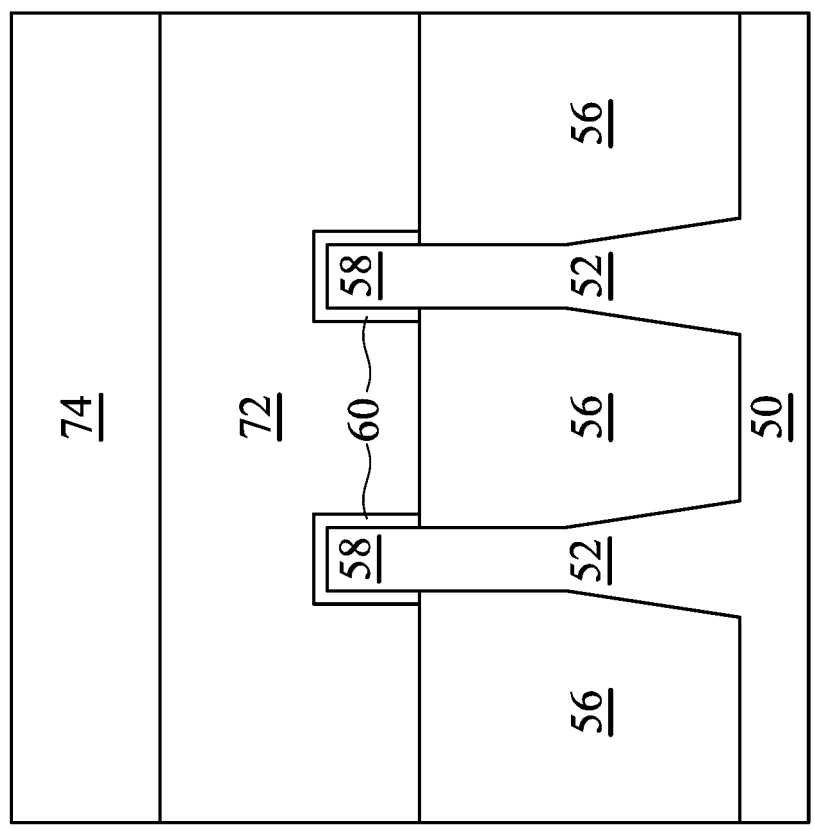
Figure 16B:
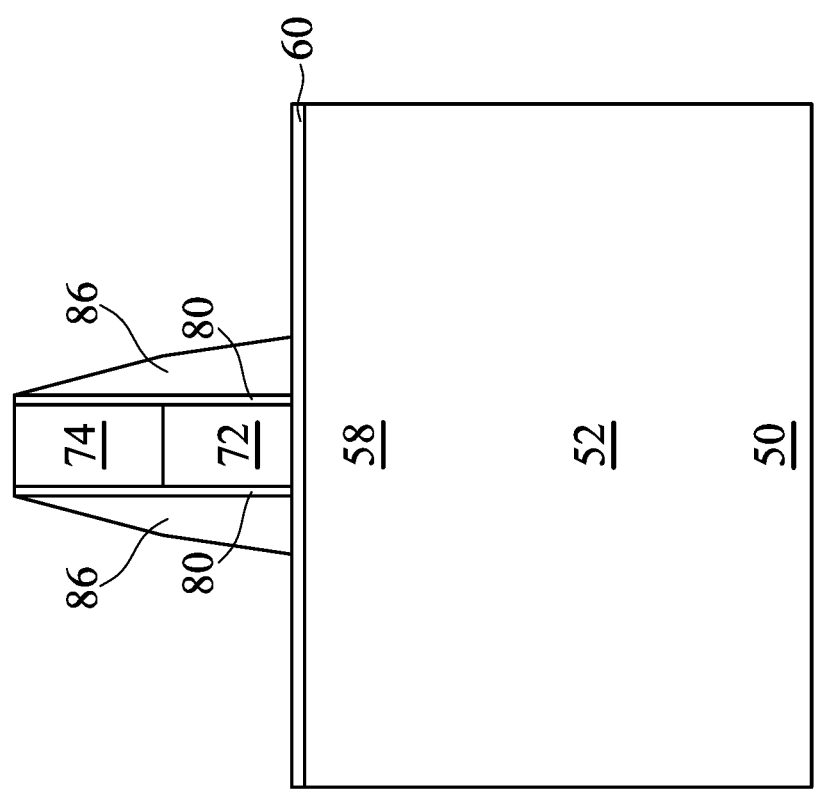

In FIGS. 16A and 16B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like.) Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 17A:
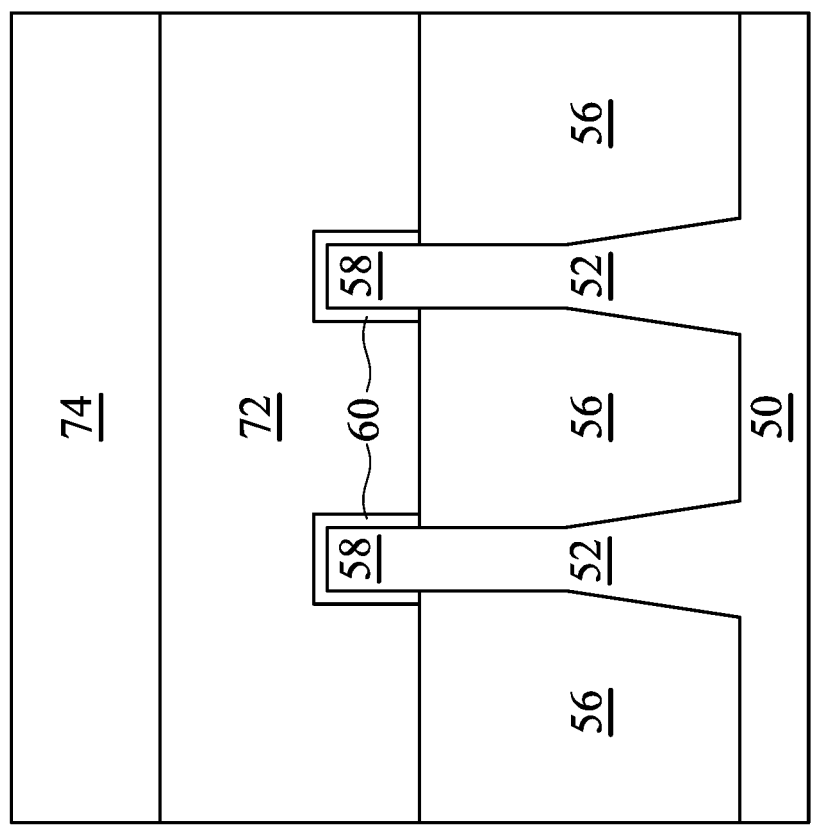
Figure 17B:
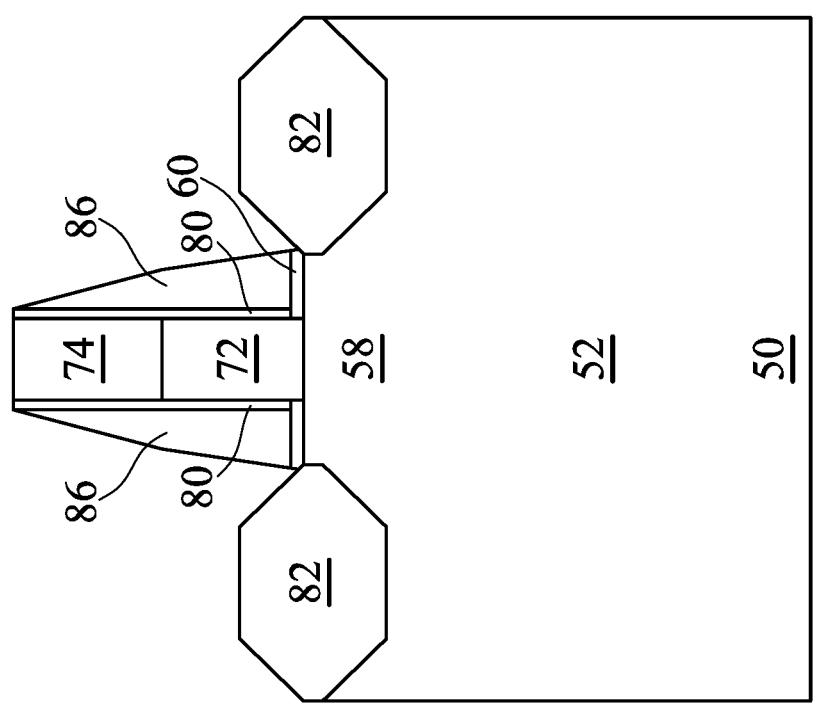
Figure 17C:
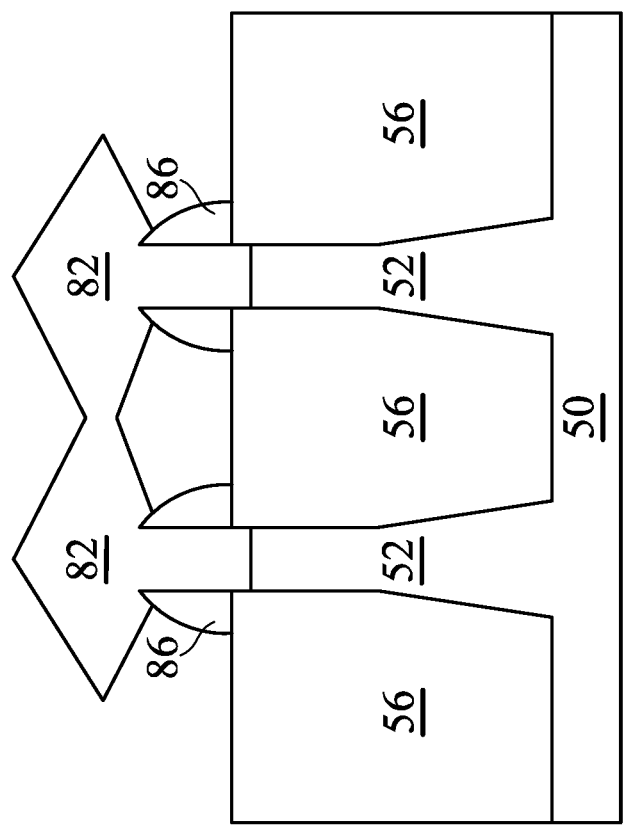
Figure 17D:
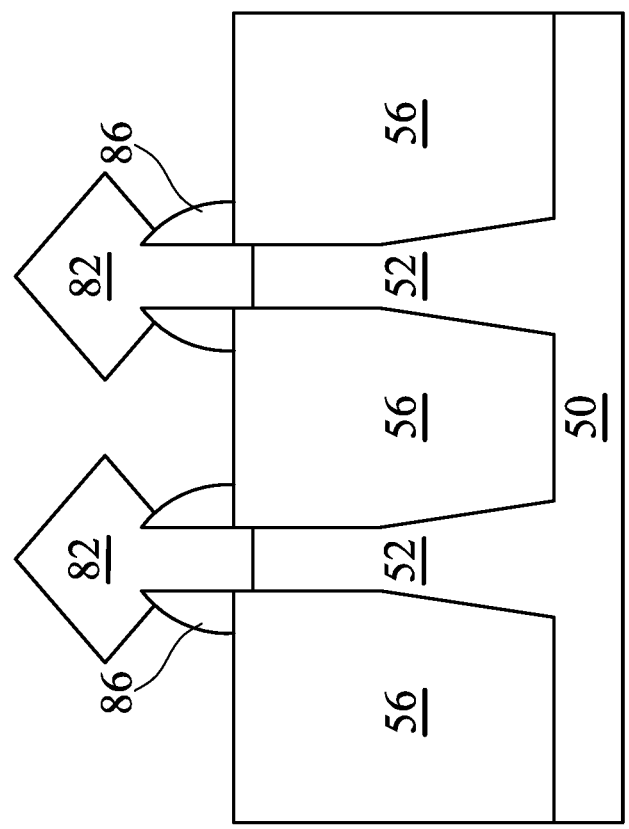

In FIGS. 17A and 17B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 17C. In other embodiments, adjacent source/drain regions 82 remain separated after the epitaxy process is completed as illustrated by FIG. 17D. In the embodiments illustrated in FIGS. 17C and 17D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 18A:
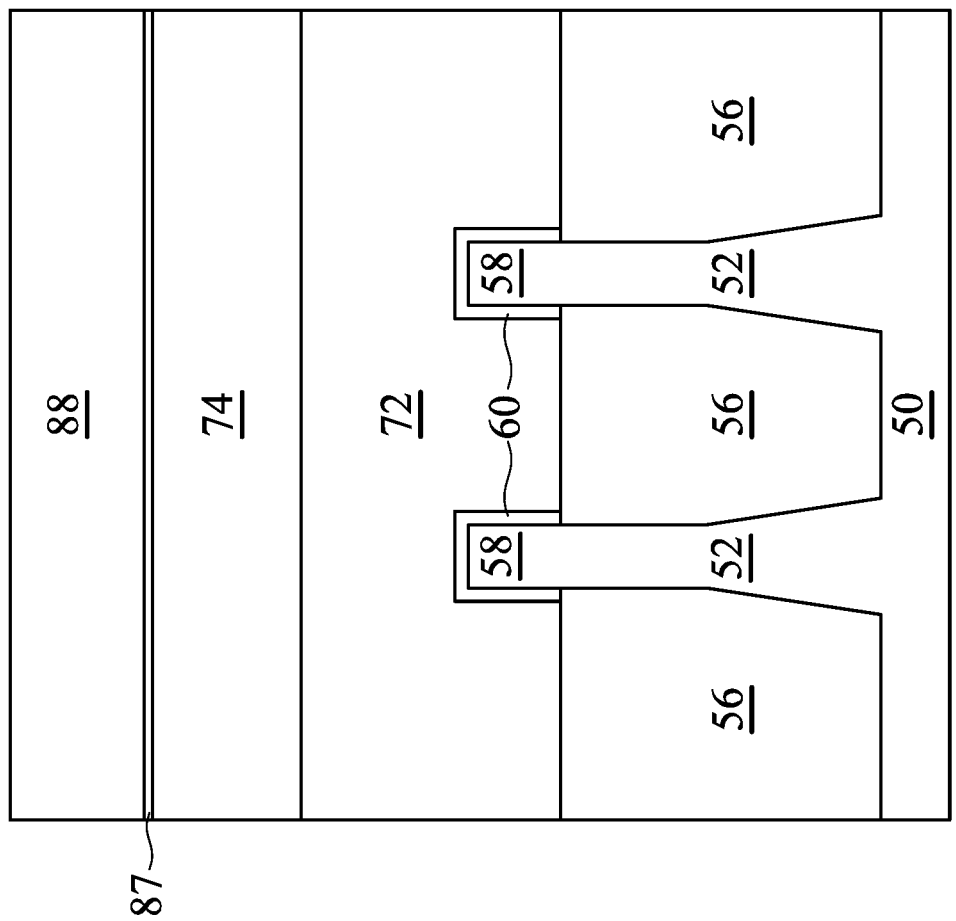
Figure 18B:
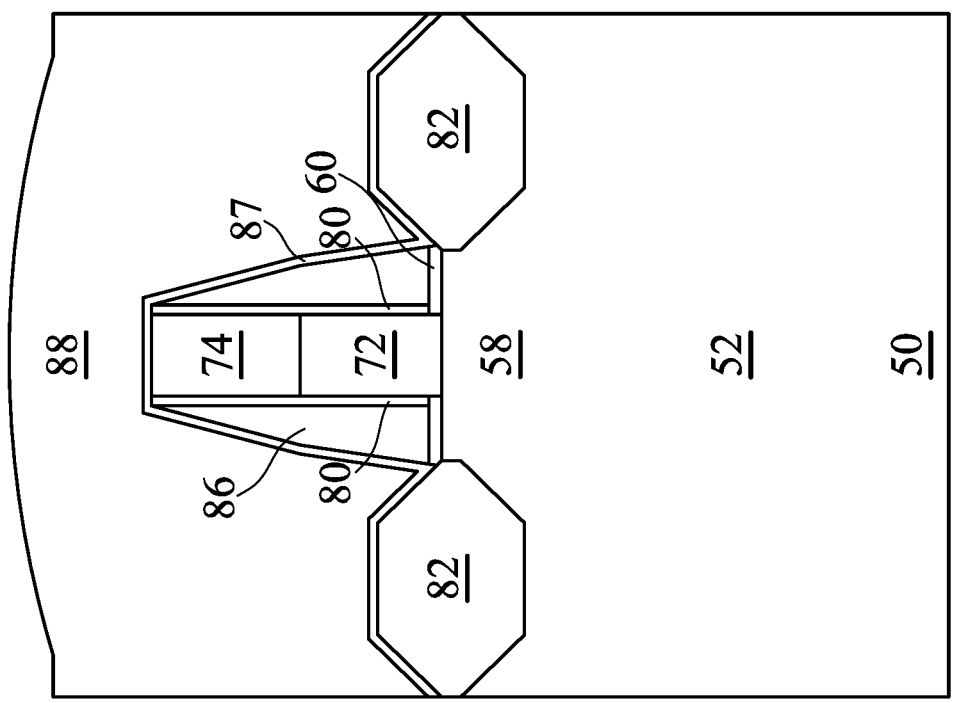

In FIGS. 18A and 18B, a first interlayer dielectric (ILD) 88 is deposited over the structure illustrated in FIGS. 17A and 17B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, the first ILD 88 is formed with materials and processes substantially the same as used to form the insulation material 54 as described above with respect to FIGS. 4-9. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as silicon nitride, silicon oxide, silicon oxynitride, or the like, having a lower etch rate than the material of the overlying first ILD 88.

Figure 19A:
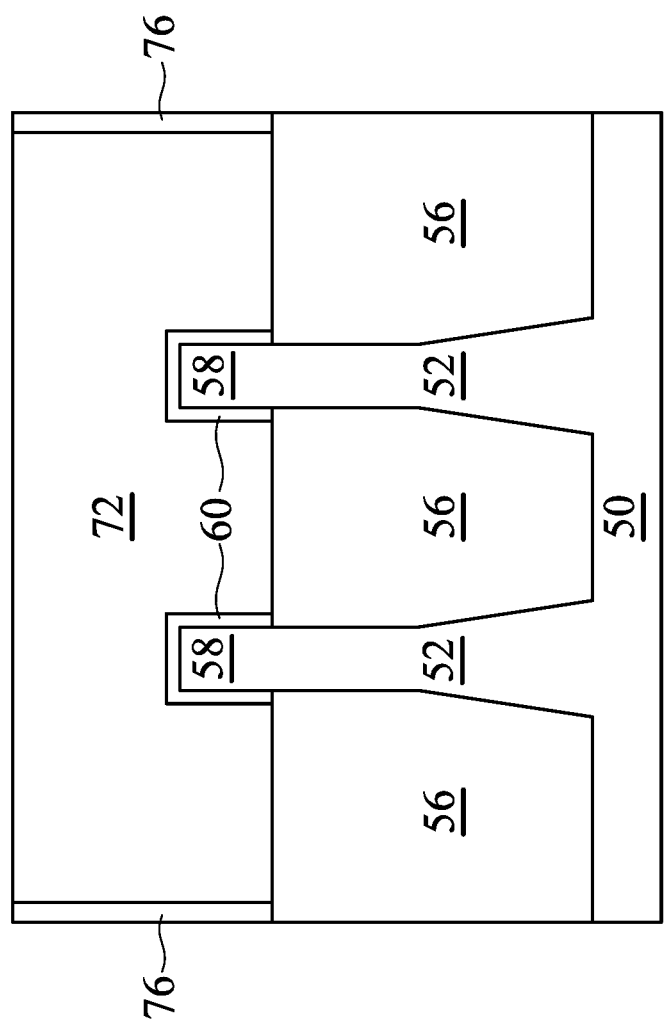
Figure 19B:
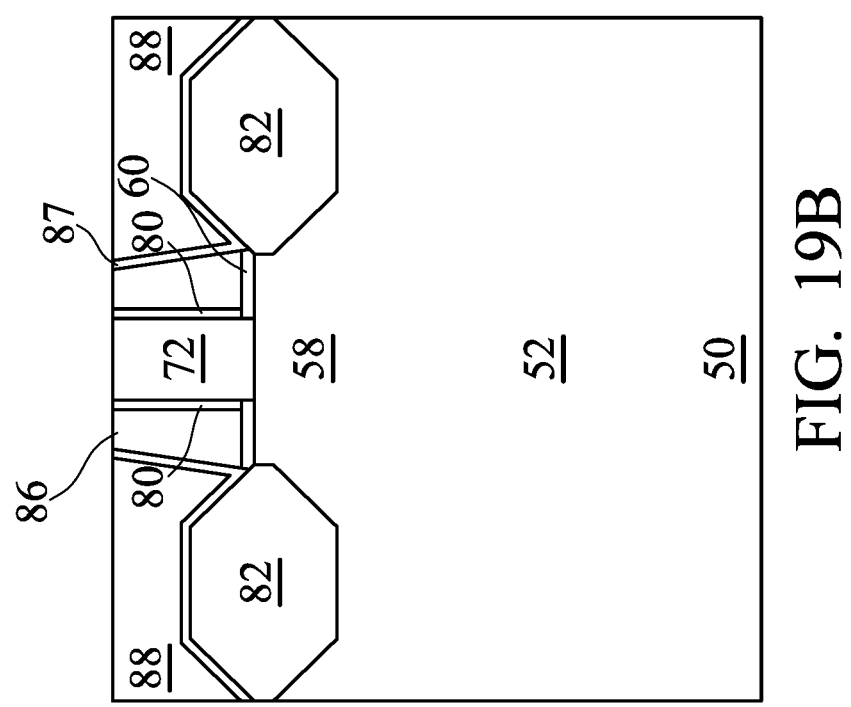

In FIGS. 19A and 19B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

In some embodiments, gate end dielectrics 76 may be formed on end sidewalls of the dummy gates 72. The gate end dielectrics 76 may, for example, be used to separate different gate electrodes. For example, in some embodiments the dummy gate 72 may extend over several fins on a substrate or wafer to form multiple transistors. Depending on a desired circuit, these transistors may require different gate electrodes. As such, the gate end dielectrics may be used as an insulating material between the different gate electrodes. As will be discussed below, the remaining portions of the dummy gates 72 will be replaced with conductive active gates, wherein the gate end dielectrics 76 remain to electrically insulate the conductive active gates from shorting together. In some embodiments, the gate end dielectrics 76 are formed after forming the gate electrodes 94 and gate masks 96 as described below with respect to FIGS. 21A-22B. The gate end dielectrics 76 may be formed by suitable lithography, patterning, and etching processes to remove portions of the dummy gates 72 or the gate electrodes 94 and gate masks 96 or by performing a dummy-gate or metal-gate cut process, thereby forming openings adjacent to or in the dummy gates 72 or the gate electrodes 94 and gate masks 96. The gate end dielectrics 76 may then be formed in the respective openings adjacent to the end sidewalls of the dummy gates 72 or the gate electrodes 94 and gate masks 96, and may be deposited by any suitable method, such as CVD, plasma-enhanced CVD (PECVD), FCVD, or ALD. In some embodiments, the gate end dielectrics 76 are formed with materials and processes substantially the same as used to form the insulation material 54 as described above with respect to FIGS. 4-9.

Figure 20B:
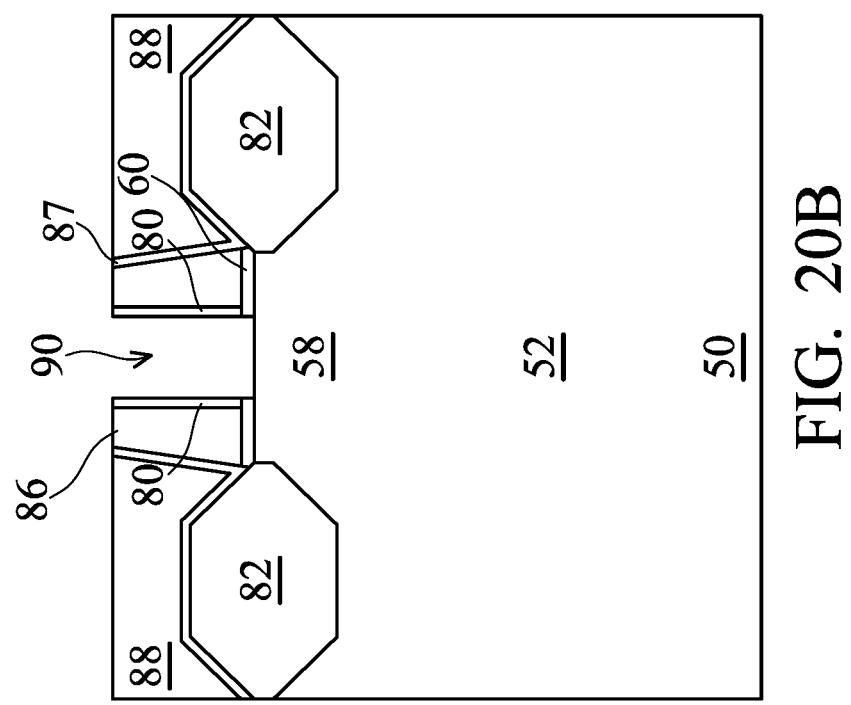

In FIGS. 20A and 20B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 21A:
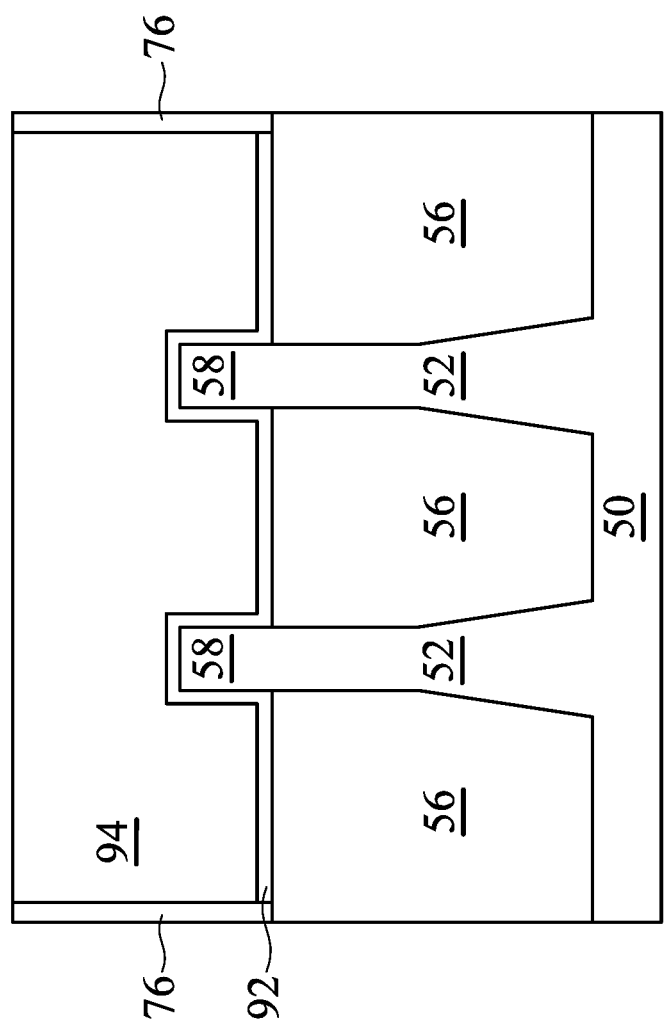
Figure 21B:
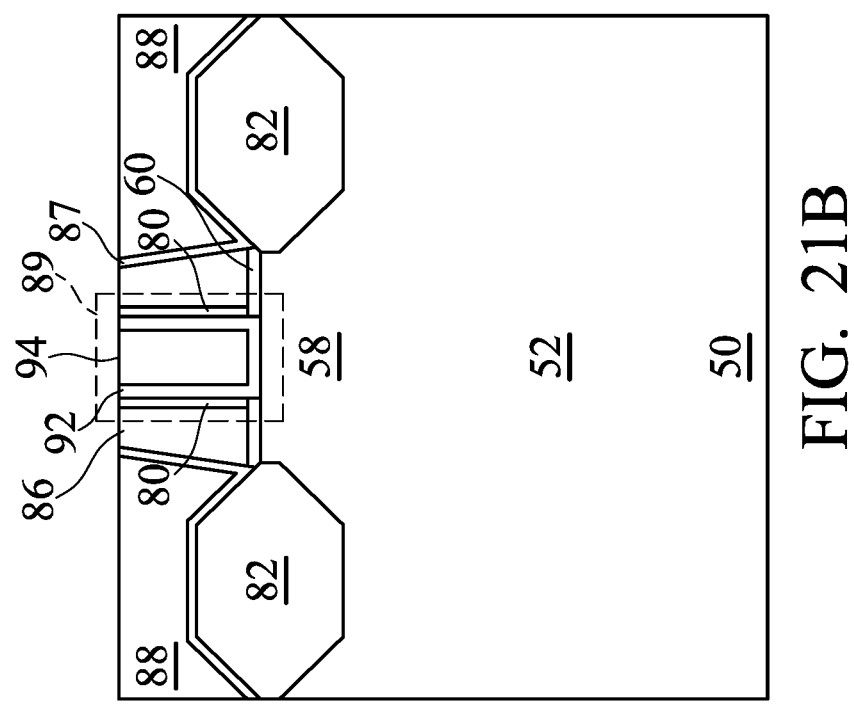
Figure 21C:
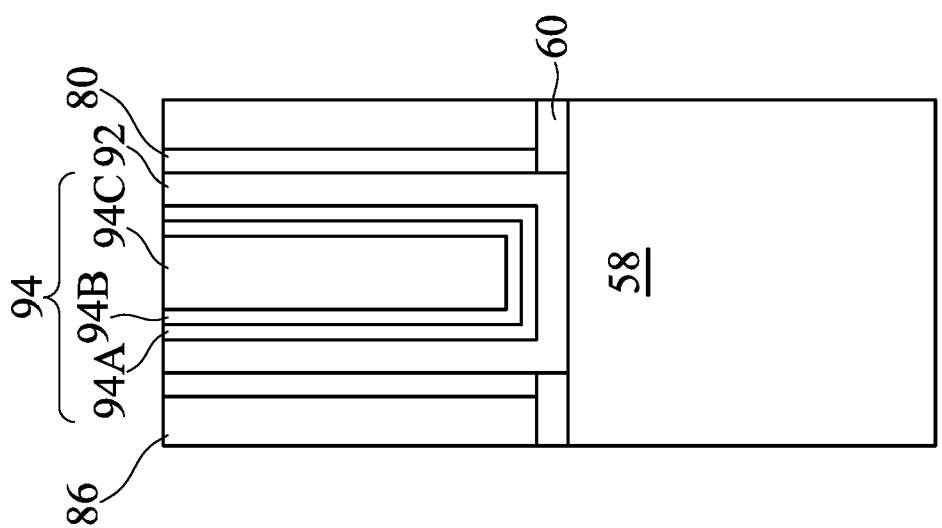

In FIGS. 21A and 21B, gate dielectric layers 92 and gate electrodes 94 are formed for replacement gates. FIG. 21C illustrates a detailed view of region 89 of FIG. 21B. Gate dielectric layers 92 may be one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 21B, the gate electrode 94 may comprise any number of liner layers 94A, any number of work function tuning layers 94B, and a fill material 94C as illustrated by FIG. 21C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 22A:
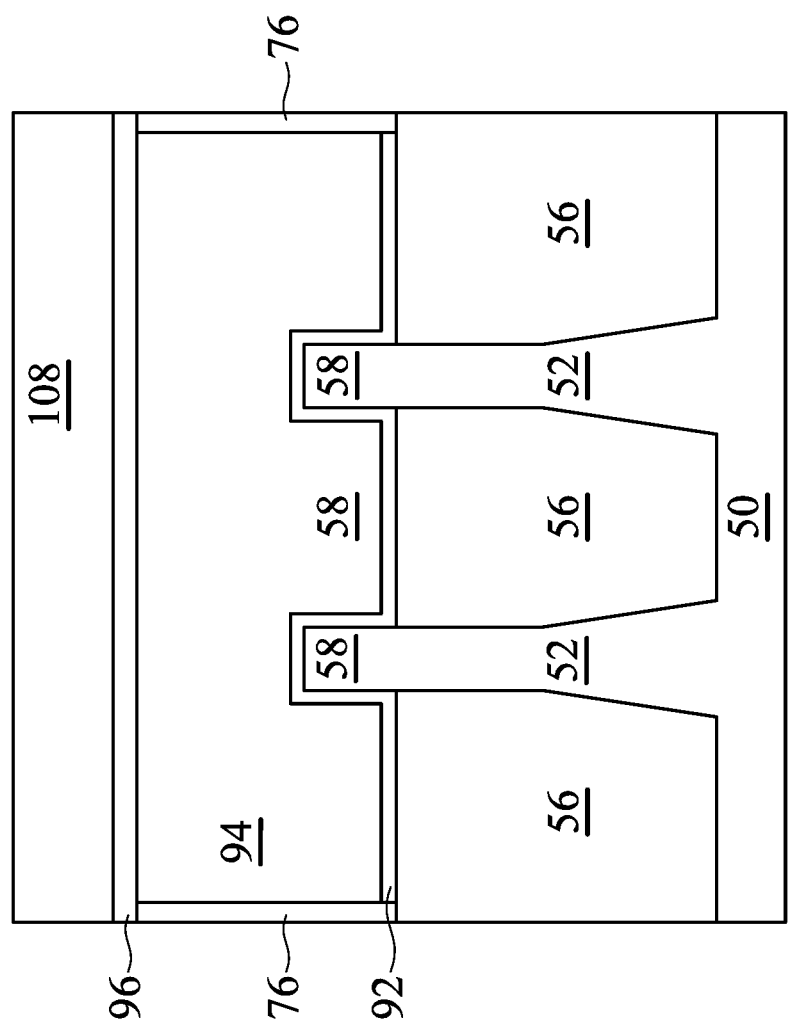
Figure 22B:
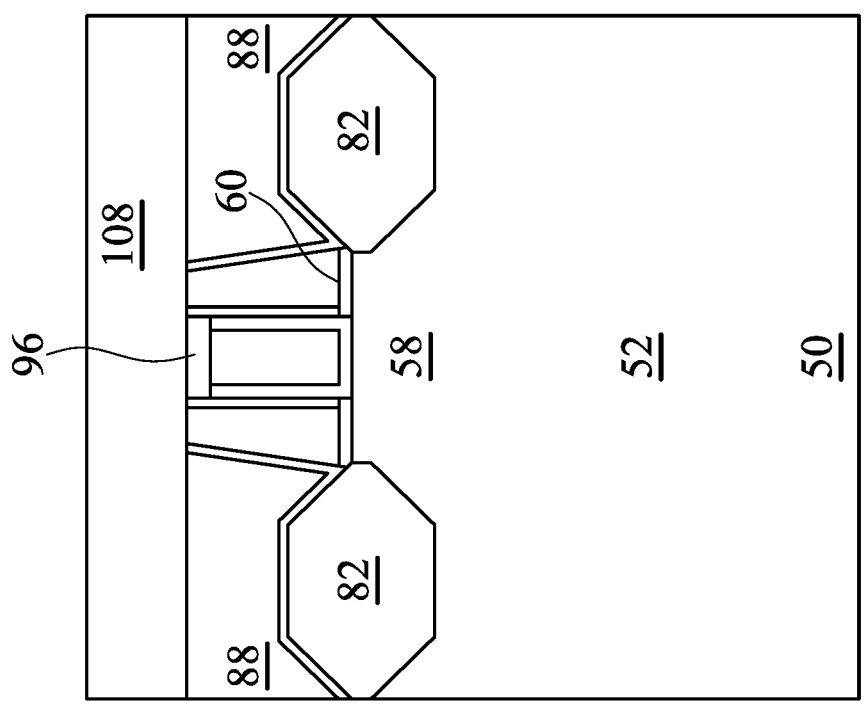

In FIGS. 22A and 22B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 22A and 22B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In some embodiments, the second ILD 108 is formed with materials and processes substantially the same as used to form the insulation material 54 as described above with respect to FIGS. 4-9. Using the same process and materials as used to form the insulation material 54 to form the second ILD 108 may reduce oxidation of the gate electrode 94, thus reducing a metal gate threshold voltage ($V_t$) shift. The subsequently formed gate contacts 110 (FIGS. 23A and 23B) penetrate through the second ILD 108 and the gate mask 96 to contact the top surface of the recessed gate electrode 94.

Figure 23A:
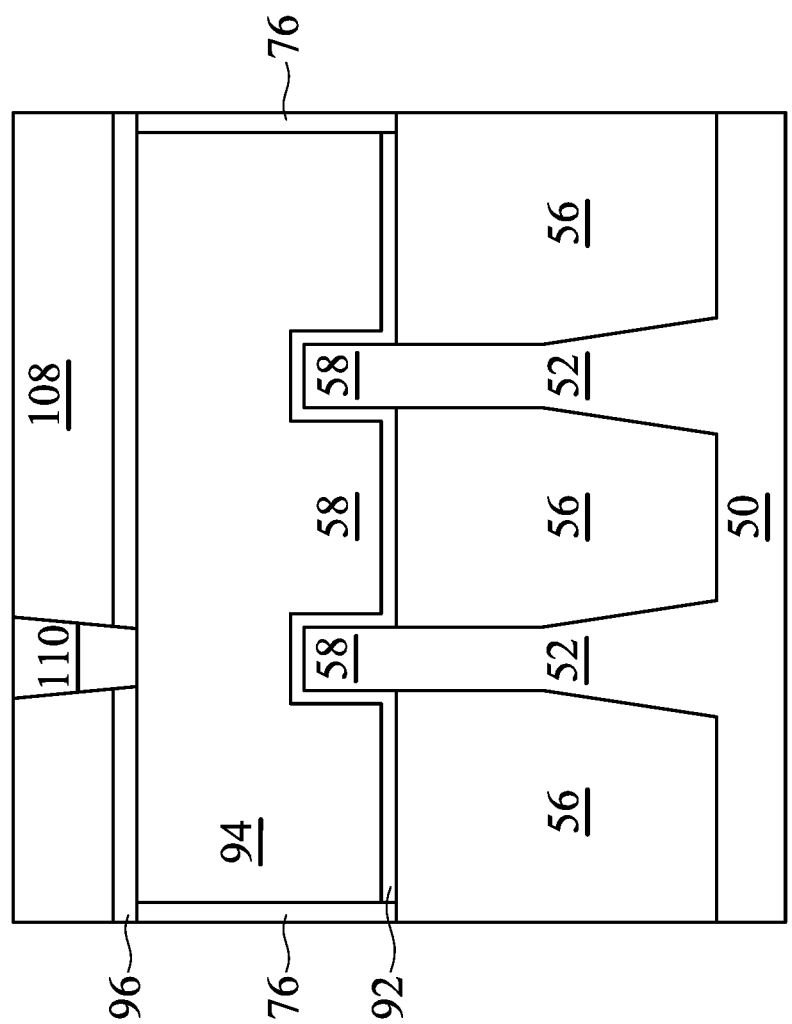
Figure 23B:
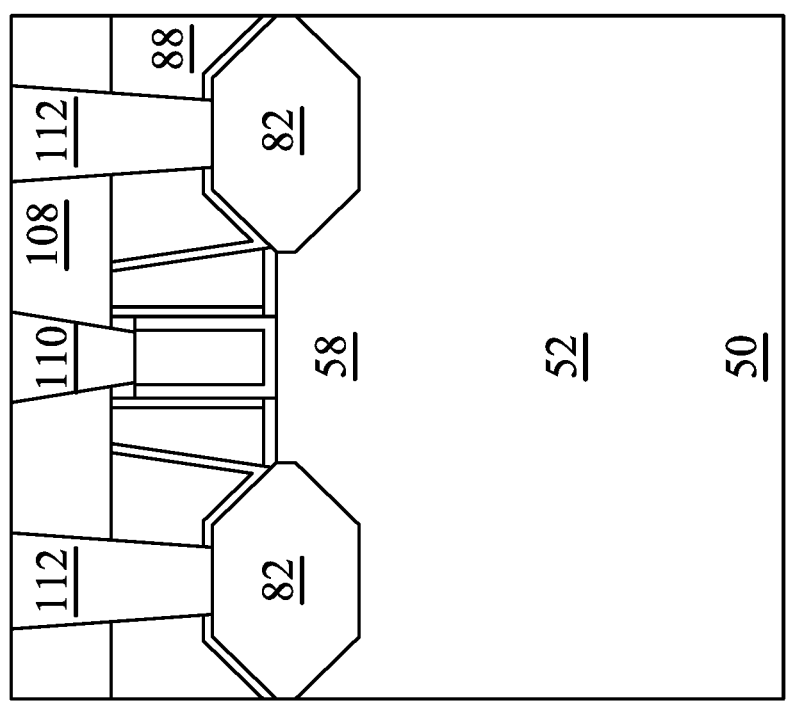

In FIGS. 23A and 23B, gate contacts 110 and source/drain contacts 112 are formed in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 24:
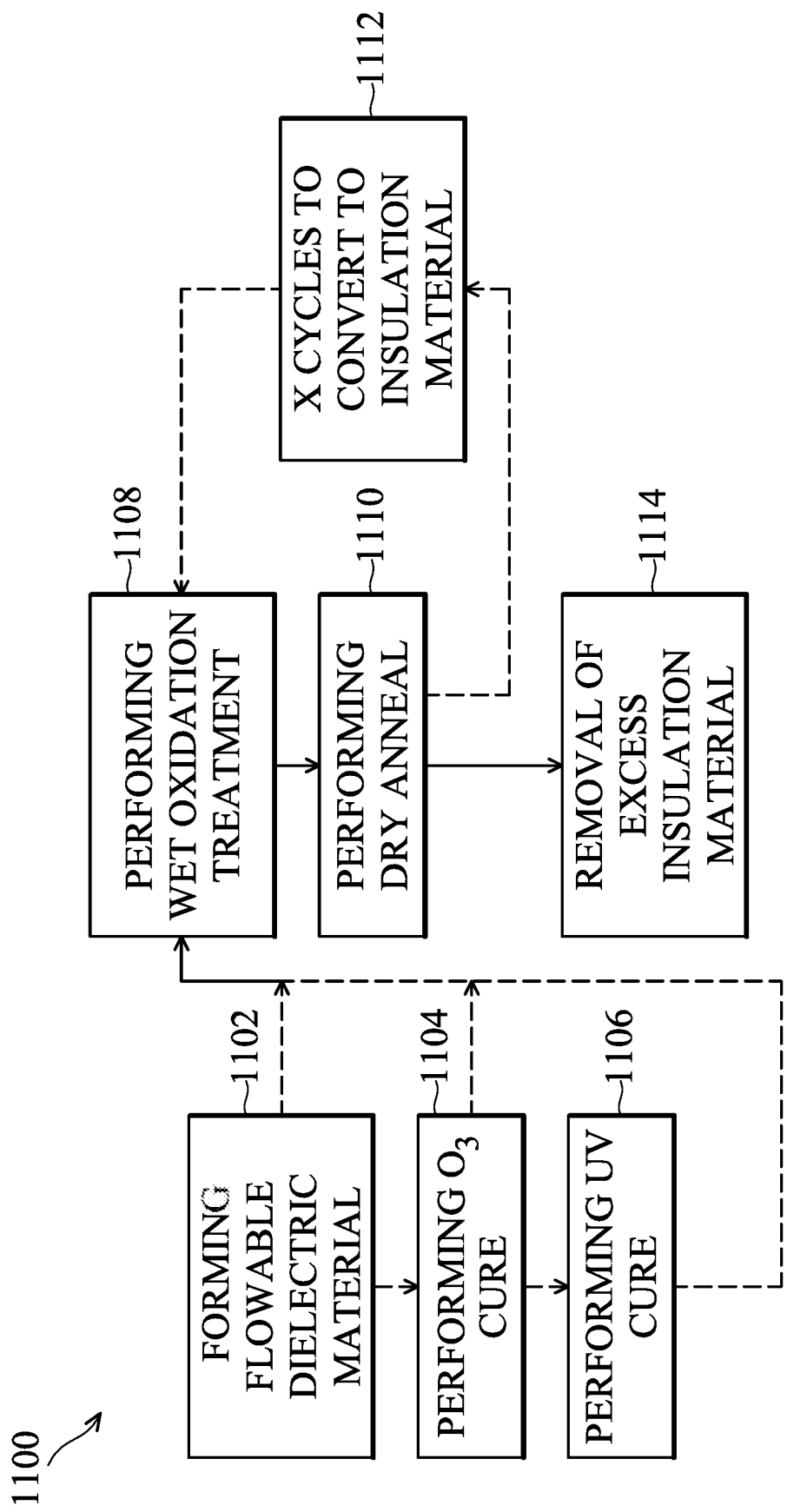
FIG. 24 illustrates a flow chart of a method of manufacturing FinFETs, in accordance with some embodiments.

FIG. 24 shows a flow chart 1100 of an embodiment method of forming an insulation material 54. In some embodiments, the method comprises a first step 1102 for forming a flowable dielectric material 154 as is shown in FIG. 4, a second optional step 1104 for performing a first cure 200 as is shown in FIG. 5, a third optional step 1106 for performing a second cure 300 as is shown in FIG. 6, a fourth step 1108 for performing a wet oxidation treatment 400 as is shown in FIG. 7, a fifth step 1110 for performing a dry anneal 500 as is shown in FIG. 8, a sixth step 1112 for repeating the fourth step 1108 and the fifth step 1110 for X cycles to convert the flowable dielectric material 154 to the insulation material 54, and a seventh step 1114 for providing a CMP operation or etching step to remove excess portions of the insulation material 54 on the surface of the mask layer as is shown in FIG. 12.

Processing steps can be removed or additional processing steps added to flow chart 1100 of FIG. 24 in some embodiments. The order of the steps shown in flow chart 1100 can also be reordered in some embodiments.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments described above may achieve advantages. Forming an insulating material may include the steps of depositing a dielectric material, curing the dielectric material using, for example, an oxygen environment and/or a ultra-violet curing process, performing a wet oxidation treatment, and performing a dry (steamless) anneal. The dielectric material can be formed using a flowable chemical vapor deposition (FCVD) process. Using the wet oxidation treatment and the dry anneal may reduce adverse effects such as the consumption of oxide definition (OD) regions, oxidation of Si and/or SiGe material in fins or other structures, the shifting of threshold voltage ($V_t$) due to oxidation of gate electrodes, and/or the like.

In accordance with an embodiment, a method of forming a semiconductor device includes: forming a flowable dielectric material; performing a wet oxidation treatment on the flowable dielectric material, the wet oxidation treatment including applying an acid and oxidizer mixture on the flowable dielectric material; and performing a dry anneal on the flowable dielectric material to cure the flowable dielectric material. In an embodiment, the acid and oxidizer mixture includes a mixture of $H_2SO_4$ and $H_2O_2$. In an embodiment, the mixture has a $H_2SO_4$ to $H_2O_2$ ratio in a range of 1:1 to 10:1. In an embodiment, the wet oxidation treatment is performed at a temperature greater than 50° C. In an embodiment, the mixture is applied at a flow rate in a range of 500 ml/min to 2200 ml/min. In an embodiment, the dry anneal is performed with a volume percentage of $H_2O$ less than 1%. In an embodiment, the dry anneal is performed at a temperature in a range of 300° C. to 800° C. In an embodiment, the method further includes performing a second wet oxidation treatment and a second dry anneal on the flowable dielectric material.

In accordance with another embodiment, a method of forming a semiconductor device includes: depositing a flowable dielectric material on a substrate; and performing a first cycle of a conversion process to convert the flowable dielectric material to an oxide, the conversion process including: applying an acid mixture to the flowable dielectric material; and annealing the flowable dielectric material with a dry anneal with a volume percentage of $H_2O$ less than 10%. In an embodiment, the method further includes performing an ozone ($O_3$) cure and an ultraviolet (UV) cure on the flowable dielectric material. In an embodiment, the $O_3$ cure is performed before performing the UV cure. In an embodiment, the UV cure is performed before performing the $O_3$ cure. In an embodiment, the acid mixture includes $H_2SO_4$ and $H_2O_2$. In an embodiment, the acid mixture has a $H_2SO_4$ to $H_2O_2$ ratio in a range of 1:1 to 10:1. In an embodiment, annealing the flowable dielectric material is performed with a volume percentage of $H_2O$ less than 1%. In an embodiment, the method further includes recessing the oxide to form a shallow trench isolation region.

In accordance with yet another embodiment, a method of forming a semiconductor device includes: depositing a first dielectric material between a first fin and a second fin; performing an ozone cure on the first dielectric material; performing an ultraviolet cure on the first dielectric material; performing at least one cycle of a conversion process for converting the first dielectric material to an oxide, the conversion process including: applying a sulfuric acid-hydrogen peroxide mixture to the first dielectric material; and performing a dry anneal on the first dielectric material; removing an excess portion of the oxide above the first fin and the second fin with a planarization; and recessing the oxide to form a shallow trench isolation region between the first fin and the second fin. In an embodiment, the first dielectric material includes perhydro-polysilazane. In an embodiment, depositing the first dielectric material includes using trisilylamine as a precursor. In an embodiment, the performing the at least one cycle of the conversion process performs at least two cycles of the conversion process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a flowable dielectric material on a sidewall of a semiconductor fin;

performing an ozone ($O_3$) cure on the flowable dielectric material;

performing an ultraviolet (UV) cure on the flowable dielectric material after performing the $O_3$ cure on the flowable dielectric material;

performing a first cycle of a conversion process, wherein the first cycle of the conversion process induces oxidation on a first sidewall of the semiconductor fin, and where the first cycle of the conversion process comprises:

performing a first wet oxidation treatment on the flowable dielectric material after performing the UV cure on the flowable dielectric material, the first wet oxidation treatment comprising applying an acid and oxidizer mixture on the flowable dielectric material at 170° C., wherein the acid and oxidizer mixture comprises a mixture of $H_2SO_4$ and $H_2O_2$, and wherein the acid and oxidizer mixture has a molarity in a range of 2 M to 18.4 M;

performing a first dry anneal on the flowable dielectric material to cure the flowable dielectric material and form an insulation material, wherein the first dry anneal is performed with a volume percentage of $H_2O$ greater than 0%, and wherein a top surface of the insulation material comprises silicon and oxygen, and a degree of oxidation of the insulation material decreases in proportion to a distance from the top surface of the insulation material;

performing a second cycle of the conversion process, wherein the second cycle of the conversion process induces no additional oxidation on the first sidewall of the semiconductor fin, and where the second cycle of the conversion process comprises:

performing a second wet oxidation treatment on the flowable dielectric material, the second wet oxidation treatment comprising applying the acid and oxidizer mixture on the flowable dielectric material at 170° C.;

performing a second dry anneal on the flowable dielectric material, wherein the second dry anneal is performed with a volume percentage of $H_2O$ greater than 0%; and forming a dummy gate over the insulation material.

2. The method of claim 1, wherein the acid and oxidizer mixture has a $H_2SO_4$ to $H_2O_2$ ratio in a range of 1:1 to 10:1.

3. The method of claim 1, wherein the acid and oxidizer mixture is applied at a flow rate in a range of 500 ml/min to 2200 ml/min.

4. The method of claim 1, wherein the first dry anneal is performed with a volume percentage of $H_2O$ less than 1%.

5. The method of claim 1, wherein the first dry anneal is performed at a temperature in a range of 300° C. to 800° C.

6. The method of claim 1, wherein the second dry anneal is performed with a volume percentage of $H_2O$ less than 1%.

7. The method of claim 1, wherein the second dry anneal is performed at a temperature in a range of 300° C. to 800° C.

8. A method of forming a semiconductor device, the method comprising:

depositing a flowable dielectric material on a sidewall of a semiconductor fin;

performing an ozone ($O_3$) cure on the flowable dielectric material, wherein the flowable dielectric material comprises silicon-hydrogen bonds and silicon-nitrogen bonds;

performing an ultraviolet (UV) cure on the flowable dielectric material after performing the $O_3$ cure on the flowable dielectric material;

performing a first cycle of a conversion process to convert the flowable dielectric material to an oxide after performing the UV cure on the flowable dielectric material, wherein performing the first cycle of the conversion process breaks the silicon-hydrogen bonds and the silicon-nitrogen bonds of the flowable dielectric material and establishes silicon-oxygen bonds of the oxide, and wherein the first cycle of the conversion process oxidizes the sidewall of the semiconductor fin, the first cycle of the conversion process comprising:

applying a first acid mixture to the flowable dielectric material at 170° C., wherein the first acid mixture comprises $H_2SO_4$ and $H_2O_2$ with a molarity in a range of 2 M to 18.4 M; and annealing the flowable dielectric material with a first dry anneal with a volume percentage of $H_2O$ less than 10% and greater than 0%;

performing a second cycle of the conversion process to further convert the flowable dielectric material to the oxide after performing the first cycle of the conversion process, wherein performing the second cycle of the conversion process is free of further oxidizing the sidewall of the semiconductor fin, the second cycle of the conversion process comprising:

applying a second acid mixture to the flowable dielectric material at 170° C., wherein the second acid mixture comprises $H_2SO_4$ and $H_2O_2$ with a molarity in a range of 2 M to 18.4 M; and annealing the flowable dielectric material with a second dry anneal with a volume percentage of $H_2O$ less than 10% and greater than 0%; and recessing the oxide to form a shallow trench isolation region.

9. The method of claim 8, wherein the first acid mixture has a $H_2SO_4$ to $H_2O_2$ ratio in a range of 1:1 to 10:1.

10. The method of claim 8, wherein the first dry anneal is performed with a volume percentage of $H_2O$ less than 1%.

11. The method of claim 8, wherein the first dry anneal is performed at a temperature in a range of 300° C. to 800° C.

12. The method of claim 8, wherein the flowable dielectric material comprises perhydro-polysilazane.

13. The method of claim 8, wherein the second dry anneal is performed with a volume percentage of $H_2O$ less than 1%.

14. The method of claim 8, wherein the second dry anneal is performed at a temperature in a range of 300° C. to 800° C.

15. A method of forming a semiconductor device, the method comprising:

depositing a first dielectric material between a first fin and a second fin;

performing an ozone cure on the first dielectric material;

performing an ultraviolet cure on the first dielectric material after performing the ozone cure on the first dielectric material;

performing a first cycle of a conversion process for converting the first dielectric material to an oxide after performing the ultraviolet cure on the first dielectric material, wherein the first cycle of the conversion process induces oxidation on sidewalls of the first fin and the second fin, the first cycle of the conversion process comprising:
applying a first sulfuric acid-hydrogen peroxide mixture to the first dielectric material at 170° C., wherein the first sulfuric acid-hydrogen peroxide mixture has a molarity in a range of 2 M to 18.4 M; and
performing a first dry anneal on the first dielectric material;
performing a second cycle of the conversion process without inducing additional oxidation on the sidewalls of the first fin and the second fin, the second cycle of the conversion process comprising:
applying a second sulfuric acid-hydrogen peroxide mixture to the first dielectric material at 170° C., wherein the second sulfuric acid-hydrogen peroxide mixture has a molarity in a range of 2 M to 18.4 M; and
performing a second dry anneal on the first dielectric material;
removing an excess portion of the oxide above the first fin and the second fin with a planarization; and
recessing the oxide to form a shallow trench isolation region between the first fin and the second fin.

16. The method of claim 15, wherein the first dielectric material comprises perhydro-polysilazane, and wherein the first dry anneal is performed with a volume percentage of $H_2O$ greater than 0%.

17. The method of claim 16, wherein the first dry anneal is performed with a volume percentage of $H_2O$ less than 1% and at a temperature in a range of 300° C. to 800° C.

18. The method of claim 15, wherein depositing the first dielectric material comprises using trisilylamine as a precursor.

19. The method of claim 15, wherein the first sulfuric acid-hydrogen peroxide mixture has a sulfuric acid to hydrogen peroxide ratio in a range of 1:1 to 10:1.

20. The method of claim 15, wherein the first dielectric material comprises silicon-hydrogen bonds and silicon-nitrogen bonds, and wherein performing the first cycle of the conversion process breaks the silicon-hydrogen bonds and the silicon-nitrogen bonds of the first dielectric material and establishes silicon-oxygen bonds of the oxide.

* * * * *